United States Patent
Tsao

(10) Patent No.: US 8,173,948 B2
(45) Date of Patent: May 8, 2012

(54) OPTICAL COUPLING APPARATUS FOR A DUAL COLUMN CHARGED PARTICLE BEAM TOOL FOR IMAGING AND FORMING SILICIDE IN A LOCALIZED MANNER

(75) Inventor: Chun-Cheng Tsao, Cupertino, CA (US)

(73) Assignee: DCG Systems, Inc., Fremont, CA (US)

( * ) Notice: Subject to any disclaimer, the term of this patent is extended or adjusted under 35 U.S.C. 154(b) by 67 days.

(21) Appl. No.: 12/582,553

(22) Filed: Oct. 20, 2009

(65) Prior Publication Data
US 2010/0038555 A1   Feb. 18, 2010

Related U.S. Application Data

(60) Division of application No. 11/222,932, filed on Sep. 8, 2005, now Pat. No. 7,612,321, which is a continuation-in-part of application No. 10/964,157, filed on Oct. 12, 2004, now Pat. No. 7,439,168.

(51) Int. Cl.
*G01J 1/42* (2006.01)
(52) U.S. Cl. .................. 250/208.3; 250/396 R
(58) Field of Classification Search .............. 250/208.3, 250/396 R; 356/369, 493, 507
See application file for complete search history.

(56) References Cited

U.S. PATENT DOCUMENTS

| | | | |
|---|---|---|---|
| 4,707,133 A * | 11/1987 | Roberts et al. ............ 356/320 |
| 4,962,389 A | 10/1990 | Kan et al. | |
| 4,992,750 A * | 2/1991 | Stewart ..................... 359/342 |
| 5,948,217 A | 9/1999 | Winer et al. | |
| 6,181,474 B1 | 1/2001 | Ouderkirk et al. | |
| 6,355,494 B1 | 3/2002 | Livengood et al. | |
| 6,376,919 B1 | 4/2002 | Li et al. | |
| 6,590,667 B1 | 7/2003 | Lee et al. | |
| 6,777,300 B2 | 8/2004 | Kittl et al. | |
| 6,828,552 B2 | 12/2004 | Hartley | |
| 6,908,561 B1 | 6/2005 | Foust et al. | |
| 7,045,791 B2 | 5/2006 | Benas-Sayag et al. | |
| 2001/0028113 A1 | 10/2001 | Kosaki et al. | |
| 2002/0197851 A1 | 12/2002 | Gavish et al. | |
| 2003/0102436 A1 | 6/2003 | Benas-Sayag et al. | |

OTHER PUBLICATIONS

Fei Company, VectraVision System FIB System for Advanced Circuit Editing, catalog, Jul. 18, 2007, p. 1-4, http://www.fei.com/Portals/_default/PDFs/content/2006_06_Vectravision_pb.pdf.
Evans Analyitical Group, Focused Ion Beam (FIB)—Circuit Edit, web page, Jul. 18, 2007, p. 1, http://www.eaglabs.com/techniques/services/fib_circuit_edit.php.
DeMarco et al., "Contact Resistance of Focused Ion Beam Deposited Platinum and Tungsten Films to Silicon", J. Vac. Sci. Technol., vol. B 19(6), pp. 2543-2546 (Nov./Dec. 2001).

(Continued)

*Primary Examiner* — Seung C Sohn
(74) *Attorney, Agent, or Firm* — Nixon Peabody LLP; Joseph Bach, Esq.

(57) ABSTRACT

An optical coupling apparatus for a dual column charged particle beam tool allowing both optical imaging of an area of an integrated circuit, as well as localized heating of the integrated circuit to form silicide. In one embodiment, optical paths from a whitelight source and a laser source are coupled together by way of first and second beam splitters so that a single optical port of the dual column tool may be utilized for both imaging and heating. In another embodiment, a single laser source is employed to provide both illumination for standard microscopy-type imaging, as well as localized heating. In a third embodiment, a single laser source provides heating along with localized illumination for confocal scanning microscopy-type imaging.

20 Claims, 14 Drawing Sheets

OTHER PUBLICATIONS

Young et al., "Focused Ion Beam Insulator Deposition", located at http://scitation.aip.org/getabs/servlet/GetabsServlet?prog=normal&id=JVTBD900001300000600257, 1 page, (Jun. 2, 1995).

Kuzmik et al., Annealing of Schottky Contacts Deposited on Dry Edtched AlGaN/GaN, Institute of Physics Publishing, Semiconductor Science and Technology, vol. 17, pp. L76-L78 (2002).

Lundquist et al., "Ultra-Thinning of C4 Integrated Circuits for Backside Analysis During First Silicon Debug", Elsevier Science Ltd., pp. 1-5 (2001).

"Optonics Introduces Industry's Most Advanced Photon-Probing Solution for Silicon Debug", Press Release, pp. 1-4 (Jul. 15, 2003).

Boit et al., "Voltage Contrast Like Imaging of N-Wells", Proceedings from the $29^{th}$ International Symposium for Testing and Failure Analysis, Santa Clara, California, pp. 331-337 (Nov. 2-6, 2003).

Le Roy et al., "N-Wells Voltage Contrast Imaging With a Focused Ion Beam", Mat. Res. Soc. Symp. Proc., vol. 792, Materials Research Society, pp. R10.9.1-R10.9.6 (2004).

* cited by examiner

OPTICAL COUPLING APPARATUS FOR A DUAL COLUMN CHARGED PARTICLE BEAM TOOL FOR IMAGING AND FORMING SILICIDE IN A LOCALIZED MANNER

CROSS-REFERENCE TO RELATED APPLICATIONS

This application is a divisional of U.S. patent application Ser. No. 11/222,932, filed Sep. 8, 2005 now U.S. Pat. No. 7,612,321, which is a continuation-in-part of U.S. patent application Ser. No. 10/964,157, filed Oct. 12, 2004, now U.S. Pat. No. 7,439,168; which are hereby incorporated herein by reference in their entirety.

FIELD OF THE INVENTION

Aspects of the present invention relate generally to the field of circuit editing using a charged particle tool, and more particularly to an apparatus and method of forming a low ohmic silicide contact at the interface between an active structure and a conductor deposited during a circuit editing procedure.

BACKGROUND

A newly-designed integrated circuit ("IC") is typically fabricated over a process of several weeks, involving preparation of silicon substrate wafers, generation of masks, doping of the silicon substrate, deposition of metal layers, and so on. The IC typically has various individual electronic components, such as resistors, capacitors, diodes, and transistors. The metal layers, which may be aluminum, copper, or other conductive material, provide the interconnection mesh between the various individual electronic components to form integrated electrical circuits. Vias formed of electrically conductive material often provide communication pathways between various metal layers. Contacts provide communication links between metal layer and individual electronic components.

Unfortunately, a new IC of any complexity rarely works as expected when first fabricated. Normally, some defects in the operation of the IC are discovered during testing. Also, some functions of the IC may operate properly under limited conditions, but fail when operated across a full range of temperature and voltage in which the IC is expected to perform. Once the IC has been tested, the designer may change the design, initiate the manufacture of a second prototype IC via the lengthy process described above, and then test the new IC once again. However, no guarantee exists that the design changes will correct the problems previously encountered, or that all of the problems in the previous version of the IC have been discovered.

Charged particle beam systems, such as focused ion beam ("FIB") systems, have found many applications in various areas of science and industry. Particularly in the semiconductor industry, FIB systems are used for integrated circuit probe point creation, failure analysis, and numerous other applications. Moreover, FIB systems may be used to edit a circuit ("circuit editing") to test design charges and thereby avoid some or all of the expense and time of testing design changes through fabrication. A FIB tool typically includes a particle beam production column designed to focus an ion beam onto the IC at the place intended for the desired intervention. Such a column typically comprises a source of ions, such as Ga+ (Gallium), produced from liquid metal. The Ga+ is used to form the ion beam, which is focused on the IC by a focusing device comprising a certain number of electrodes operating at determined potentials so as to form an electrostatic lens system. Other types of charged particle beam systems deploy other arrangements to produce charged particle beams having a desired degree of focus.

As mentioned above, IC manufacturers sometimes employ a FIB system to edit the prototype IC, thereby altering the connections and other electronic structures of the IC. Circuit editing involves employing an ion beam to remove and deposit material in an IC with precision. Removal of material, or milling, may be achieved through a process sometimes referred to as ion sputtering. Addition or deposition of material, such as a conductor, may be achieved through a process sometimes referred to as ion-induced deposition. Through removal and deposit of material, electrical connections may be severed or added, which allows designers to implement and test design modifications without repeating the wafer fabrication process.

One particular problem in conventional circuit editing involves forming a connection with semiconductor electronic components, such as a connection with the n-diffusion or p-diffusion regions of a semiconductor transistor structure. Platinum or Tungsten based conductors are typically employed to form a conductive path during circuit editing procedures. In conventional FIB-based deposition processes, these conductors form good contacts with metal layers, but form poor, typically rectifying contacts, with semiconductor electronic components. This problem is alleviated to some extent when circuit editing is performed through the top side of a chip, i.e., through the metal layers, where metal to semiconductor connections are already available to form conductive contacts. During the IC fabrication process, the contact directly to the semiconductor material is enabled through an anneal, which forms silicide that couples the semiconductor material to the metal conductor. Silicide is desired because it provides a good electrical contact, not rectifying but ohmic, between the semiconductor structure and metal interconnections.

Due to the increasing density of metal interconnections and number of metal layers, FIB based circuit editing through the topside of an IC is increasingly difficult. It is often the case that FIB milling to define access holes to reach a deep metal layer in the semiconductor structure would damage or destroy other structures or layers along the way. To avoid this, increasingly, FIB circuit editing is performed through the backside silicon substrate of the chip. While going through the backside allows a virtually unimpeded connectivity to the desired locations, there is no preexisting metal to which a conductor may be attached. A conventional approach for creating an ohmic contact between a probe or conductor or semiconductor structure during fabrication is to anneal the contact area; however, conventional fabrication annealing is not feasible if the IC has already been fabricated because the anneal temperature would damage or destroy the temperature-sensitive components.

Thus, the efficiency and potential of FIB-based circuit editing techniques are limited by the difficulty or impossibility in forming contacts with various semiconductor structures using conventional post-fabrication techniques.

SUMMARY

One aspect of the present invention involves a method of editing an integrated circuit having a semiconductor substrate and having at least one semiconductor structure formed therein. The method comprises removing some portion of the semiconductor substrate. Then, depositing a conductive material in electrical communication with the at least one semiconductor device. The method finally comprises applying localized heat to form a substantially ohmic contact between the conductive material and the at least one semiconductor structure. The ohmic contact may comprise silicides, formed in response to the localized application of heat.

Another aspect of the present invention involves a method of forming a localized ohmic contact between a conductive material and a semiconductor material. The method comprises providing a substrate having at least one doped semiconductor portion and forming a trench extending from a side of the substrate to the at least one doped semiconductor portion. Then, applying heat energy in a localized manner to the at least one doped portion so as to create an interface in the at least one doped portion that enables coupling in an ohmic manner to a conductive material deposited in the trench. The application of localized heat forming an ohmic contact between the interface and the conductive material.

Another aspect of the present invention involves a method of forming a localized ohmic contact between a conductive material and a semiconductor structure comprising the operation of: a step for forming a trench in a substrate of an integrated circuit including the semiconductor structure; a step for applying localized heat in region adjacent the conductive material and the semiconductor structure; and whereby an ohmic contact is formed between the conductive material and the semiconductor structure.

Any of the various methods conforming to the present invention may be embodied in, or employed in conjunction with, a circuit editing tool, such as an electron beam tool or focused ion beam tool, suitably modified to implement one of the methods conforming to the present invention.

To employ the various methods of the present invention, several embodiments of the present invention described herein provide an optical coupling apparatus for a dual column charged particle beam tool, such as the abovementioned focused ion beam tool. Typically, a dual column tool, described in the following detailed description, provides a single optical port to allow optical imaging of an area of an integrated circuit in conjunction with editing of an integrated circuit. Embodiments of the invention allow both optical imaging of an area of the integrated circuit, as well as localized heating of the integrated circuit to form silicide, through the optical port of the tool.

In one embodiment of the invention, optical paths from a whitelight source and a laser source are coupled together by way of first and second beam splitters so that a single optical port of the dual column tool may be utilized for both imaging and localized heating. In another embodiment, a single laser source provides both illumination for standard microscopy-type imaging, as well as localized heating, through the optical port. In yet another embodiment, a single laser source provides heating along with localized illumination for confocal scanning microscopy-type imaging via the optical port.

Other embodiments and advantages of the present invention will become apparent after reading the following detailed description and associated drawings.

DETAILED DESCRIPTION OF EMBODIMENTS OF THE INVENTION

Aspects of the present invention involve an apparatus and method for localized silicide formation in a fabricated integrated circuit ("IC"). In one implementation of the invention, silicide is formed in a conductor deposited during a circuit editing procedure using a focused ion beam tool. Other conductor deposition techniques, such as those employing electron beam and laser, will also be used in implementations conforming to the present invention. In various methods and apparatus conforming to the present invention, localized silicide formation is generally achieved through targeted application of heat at a target location sufficient for silicidation to occur at the contact between a deposited conductor and an adjacent semiconductor structure. As used herein, the term "semiconductor structure" refers to any active or passive circuit structure formed from appropriate doping of a semiconductor base material, such as silicon, silicon germanium, germanium, and gallium arsenide. Some examples of semiconductor structures include transistors and diodes formed in a complementary metal oxide semiconductor ("CMOS") and/or bipolar arrangements with appropriate diffusions.

Particular aspects of the invention involve application of a laser on the target location, application of a potential and resultant current flow through a target location, a combination of laser radiation and current flow to locally heat the target location, or some other locally directable heat source alone or in combination with another heat source, sufficient to facilitate silicidation formation at the target location. The target location for localized application of heat may be the deposited conductor, an area of the integrated circuit adjacent the deposited conductor (before, during, or after deposition), or a combination thereof. Through targeted application of heat, the typically rectifying conductor contact becomes an ohmic contact at the boundary of the conductor and a semiconductor structure without damage to surrounding semiconductor structures, contacts, metal, and other IC components.

Figure 1:
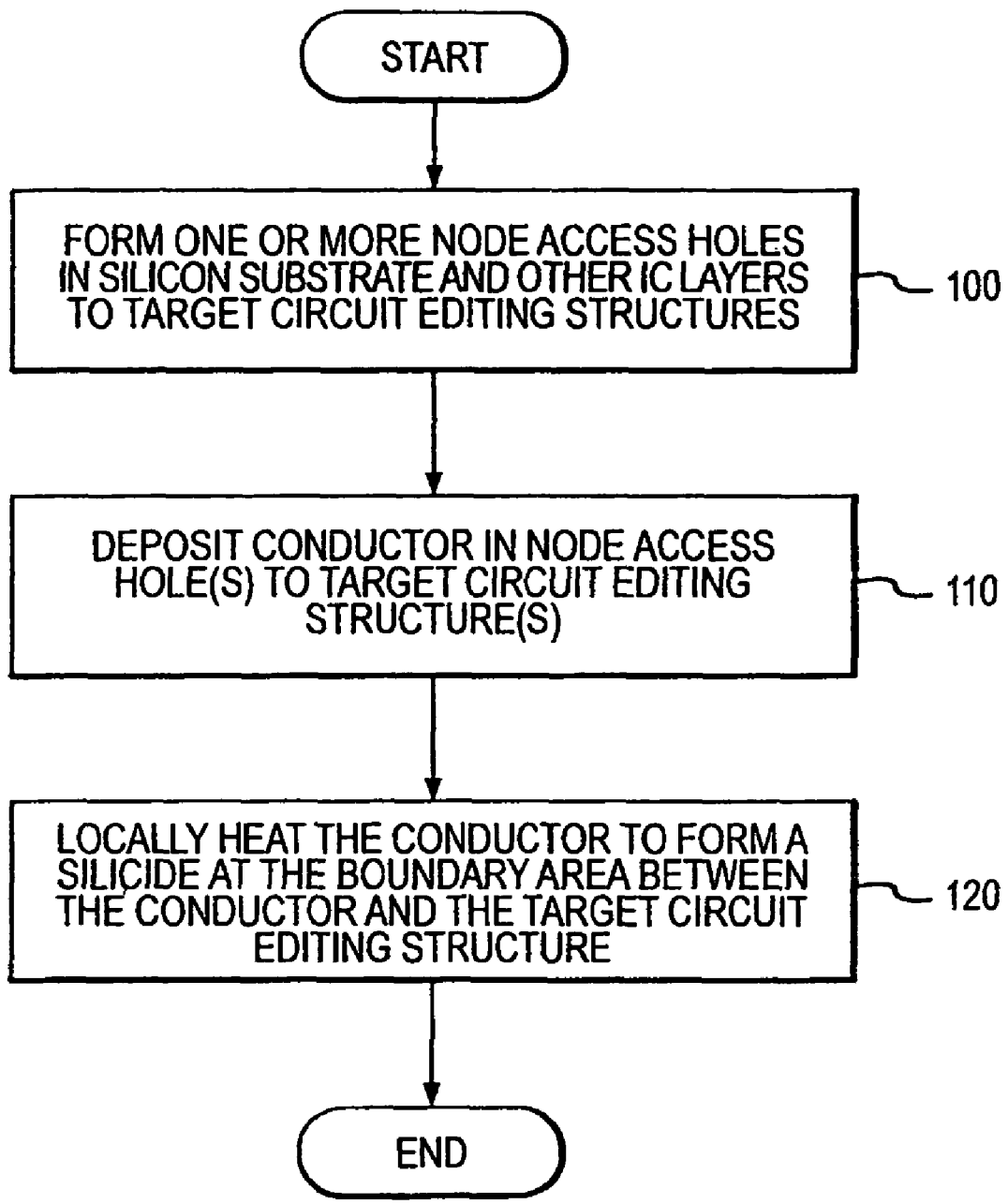
FIG. 1 is a flowchart illustrating one method for localized silicide formation in a post-fabrication deposited conductor, in accordance with one embodiment of the present invention.
Figure 2:
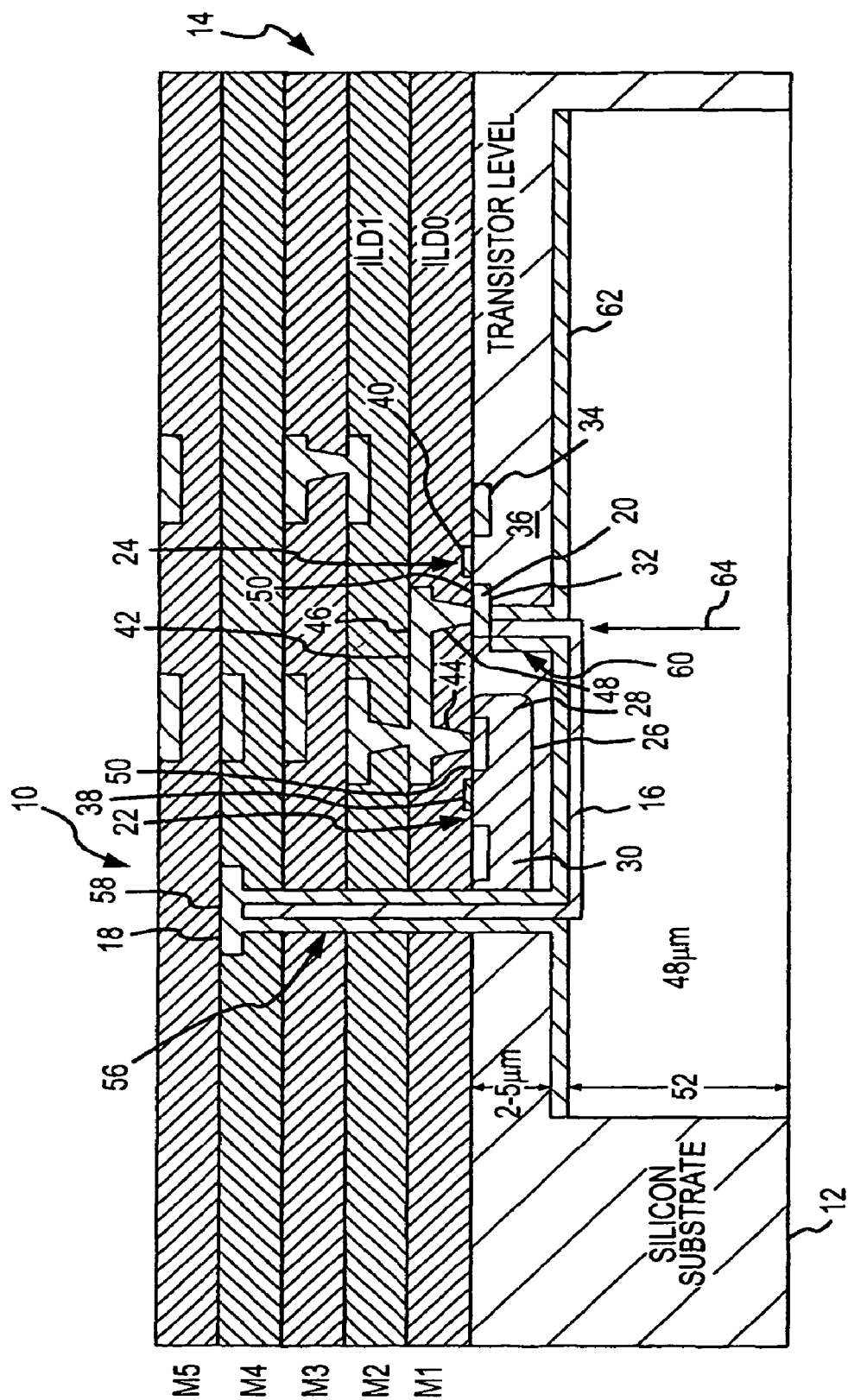
FIG. 2 is a schematic section view of an integrated circuit illustrating localized heating of a conductor in order to form a silicide at the diffusion region of a transistor configuration, in accordance with one embodiment of the present invention.

The operations of the method conforming to the present invention shown in the flowchart of FIG. 1 are discussed herein with reference to the portion of an IC shown in FIG. 2. The IC of FIG. 2 and others herein are CMOS based ICs; however, the methods and apparatus conforming to the present invention discussed herein may be applied to bipolar and other ICs as well. An integrated circuit 10 includes a semiconductor substrate 12 with transistors and other semiconductor structures formed at the top of the substrate through oxidation, diffusion, and other methods. Above the substrate, are several metal layers 14 (M1, M2, etc.) containing the various metal interconnects that provide the communication pathways between the semiconductor structures of the IC.

Referring to FIG. 1, to process an IC in accordance with a method conforming to the present invention, one or more node access holes are milled in the IC to form conduits to target circuit editing structures (operation 100). In some implementations, it may be necessary to form a trench in the silicon substrate of the IC below the target circuit editing structures. From the trench, the node access holes provide discrete access to target circuit editing structures. In one example, a focused ion beam is employed to mill the node access holes and any trenches in the IC.

Referring to FIG. 2, a schematic diagram of a section of an example IC is shown, with an example of a conductive pathway 16 formed between two target circuit editing structures (18, 20). In the example IC, a p-type MOS field effect transistor ("P-FET") 22 and a n-type MOS field effect transistor ("N-FET") 24 are shown in an inverter-like configuration. In this example, the conductive pathway is formed in order to test a design change. The P-FET transistor includes an n-well 26 and p-diffusion regions (drain 28 and source 30). In contrast, the N-FET transistor includes n-diffusion regions (drain 32 and source 34) and a p-well 36 is provided by the substrate 12, which is a p-type substrate. Each transistor arrangement includes a gate (38, 40) between the respective source and drain. In an inverter configuration there is a connection 42 between the drains of each transistor. This connection may be provided in any of the metal layers. To form the drain connection, a first contact 44 provides a connection between the drain of the P-FET and a link 46 in the M1 layer. Further, a second contact 48 provides a connection between the drain of the N-FET and the link in the M1 layer. Silicide formed during the fabrication process is a thin layer 50 between each contact and the semiconductor structures (drains of each transistor, in the example of FIG. 2).

As mentioned above, a trench 52 is defined in the substrate adjacent the bottom side of the transistors. In some examples discussed herein, the trench may be referred to as a global trench as it spans at least the distance between target circuit editing structures. Trenches are defined in the substrate to provide access for subsequent trenches and node access holes or to expose a target structure where some type of editing will take place. A global trench may be necessary to clear away sufficient material to properly image and locate target IC structures. Upon identification of the target structures, more precise (discrete) trenches or nodes may be milled for access to a particular target circuit editing structure, e.g., a metal line or semiconductor structure. In the example of FIG. 2, the global trench is about 48 µm deep in the substrate, leaving about 2-5 µm of substrate.

In some particular implementations, a FIB tool is employed to mill a trench or a node access hole. To mill or "etch" the trench, a gallium ion beam is directed on the target surface in the presence of xenon difluoride ($XeF_2$) gas. Other charged particle beams and/or gas mixtures may be employed.

In the particular example IC of FIG. 2, besides the global trench, a first node access hole 56 is defined between the global trench and a metal four layer ("M4") interconnect 58. As such, the first node access hole extends from the trench 52, through the substrate 12 and the metal one ("M1"), metal two ("M2"), and metal three ("M3") layers. The node access hole may be milled using a FIB tool along with the appropriate gas mixture, such as $XeF_2$, as mentioned above. A second node access hole 60 is defined between the global trench and the n-diffusion region (drain) 32 of the N-FET transistor (a semiconductor structure). The second node access hole may also be milled using a FIB tool. The node access holes provide conduits to the target circuit editing structures (M4 link and N-FET drain).

Along the top of the global trench and along the side walls of the node access holes is an insulator 62. The insulator electrically isolates the deposited conductor 16 (discussed in more detail below) from the substrate 12 and other features where an electrical connection is not desired. Additionally, the insulator may provide a thermal barrier to help reduce heat transfer into the substrate or other structures during localized heating to form silicide (also discussed in more detail below). The focused ion beam tool is versatile. Besides milling, the insulator may be deposited using a FIB tool in combination with the appropriate gas mixture. In one particular implementation, a gallium focused ion beam is directed into the trench walls in the presence of a $SiO_x$ gas precursor. In any particular milling or deposition process, the beam power, current density, and time of application will vary depending on numerous factors particular to an application.

Referring again to FIG. 1, after formation of the appropriate trenches, a conductor is deposited between the target structures of the IC (operation 110). Referring again to FIG.

2, in this example, the conductor 16 is deposited between the M4 interconnect 58 (target circuit editing structure 18) and the n-diffusion (drain) 32 region of the N-FET transistor (the target semiconductor structure 20). As such, the conductor is deposited in the first and second node access holes (56, 60), and along the top of the global trench 52 between the node access holes. In one example, a platinum or tungsten conductor may be deposited using a FIB tool along with the appropriate platinum or tungsten organometallic precursor gas. Generally, energy from the focused ion beam (or other charged particle beam) causes dissociation of the precursor gas, with the metal being deposited and the organic component volatilizing. Other conductor materials, such as cobalt, aluminum, copper, silver, and gold, and conductor deposition methods may also be used in various embodiments conforming to the present invention.

As mentioned above, using conventional FIB-based deposition techniques, an electrical connection may be made between the deposited conductor and a metal layer. However, conventional techniques typically do not provide an ohmic connection between a semiconductor structure, such as the n-diffusion or p-diffusion regions of a CMOS transistor, and a deposited conductor. Thus, before further processing conforming to the present invention, the connection between the deposited conductor and the diffusion region of the N-FET is rectifying.

Referring again to FIG. 1, in one implementation of the present invention, the conductor is locally heated adjacent the target semiconductor structure in order to form a silicide at the interface of the semiconductor structure and the conductor (operation 120). Referring particularly to FIG. 2, a local heat source 64 is applied to the deposited conductor 16 below the n-diffusion region 32 of the N-FET transistor. The temperature required for silicide formation is a function of the deposited conductor material. For example, silicide formation in a platinum conductor begins at about 450° C. whereas silicide formation in a tungsten conductor begins at about 600° C. With an apparatus and a method conforming to the present invention, it is possible to form an ohmic contact between a deposited conductor and a semiconductor structure by locally heating the deposited conductor (or the area adjacent thereto) where an ohmic contact is desired. As such, FIB-based or other charged particle tool circuit editing (electron beam or laser based) may be expanded to build electrical connections between metal layers and semiconductor structures and from one semiconductor structure to another in a fabricated IC, greatly expanding the range of possible circuit edits.

Figure 3:
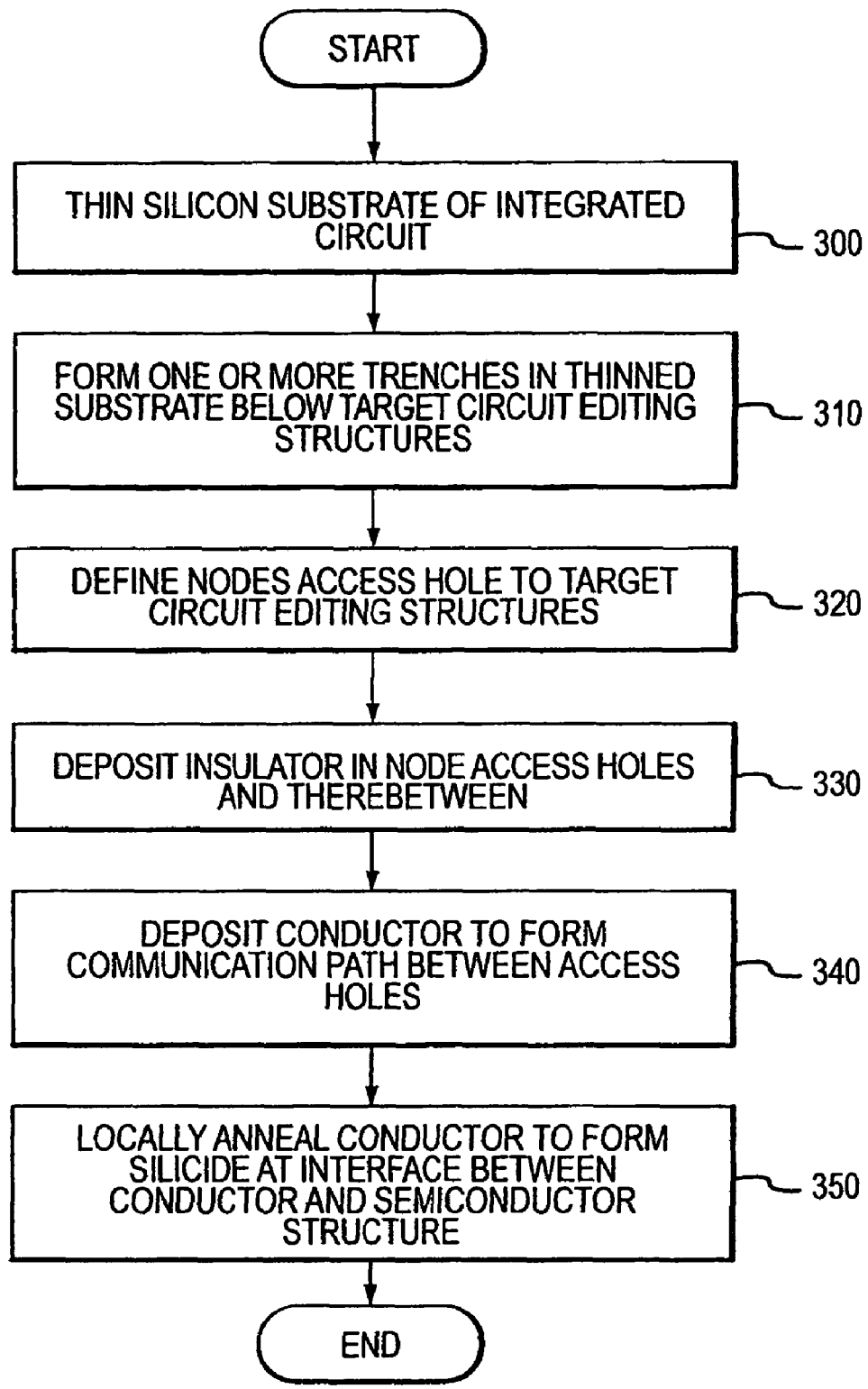
FIG. 3 is a flowchart illustrating a second method for localized silicide formation in a post-fabrication deposited conductor, in accordance with one embodiment of the present invention.

An alternative method conforming to the present invention is shown in the flowchart of FIG. 3. At the start of a circuit editing operation, a substrate thinning technique, typically referred to as "lapping," is employed to remove some portion of the substrate (operation 300). It is also possible to use other thinning or polishing techniques, such as a chemical mechanical polishing and planarization technique, a FIB tool with a gas enchant (e.g., XeF$_2$), other charge particle tools, and electron beam or laser activated chemical etch options, to thin all or only target portions of the substrate. Typically, the entire substrate of the IC is uniformly thinned before further processing, but it is not necessary to thin the entire substrate.

Next, a charged particle beam is employed to form a trench in the substrate below the target structure or structures where circuit editing is to take place (operation 310). The trench is intended to additionally thin the substrate so that the target semiconductor structures or other portions of the IC become detectable. For example, the Credence Systems Corporation OptiFIB™ focused ion beam tool includes an optical microscope coaxially oriented with the focused ion beam tool. With such a device, it is possible to obtain an image of the portion of the IC being processed with the FIB tool. When certain features become visible, the user is able to identify the target structures or other structures for further processing. The process of particularly identifying target structures is discussed in more detail below. It is possible to form one or more trench configurations of differing sizes depending on a particular IC structure being accessed or a particular implementation of the present invention. In the IC of FIG. 2, a single global trench 52 is defined below the target active structures with node access holes providing conduits to the target structures, whereas in FIG. 4 (discussed below) a two-tiered trench is defined in the substrate in addition to the node access holes providing conduits to the target structures of the IC.

Figure 4:
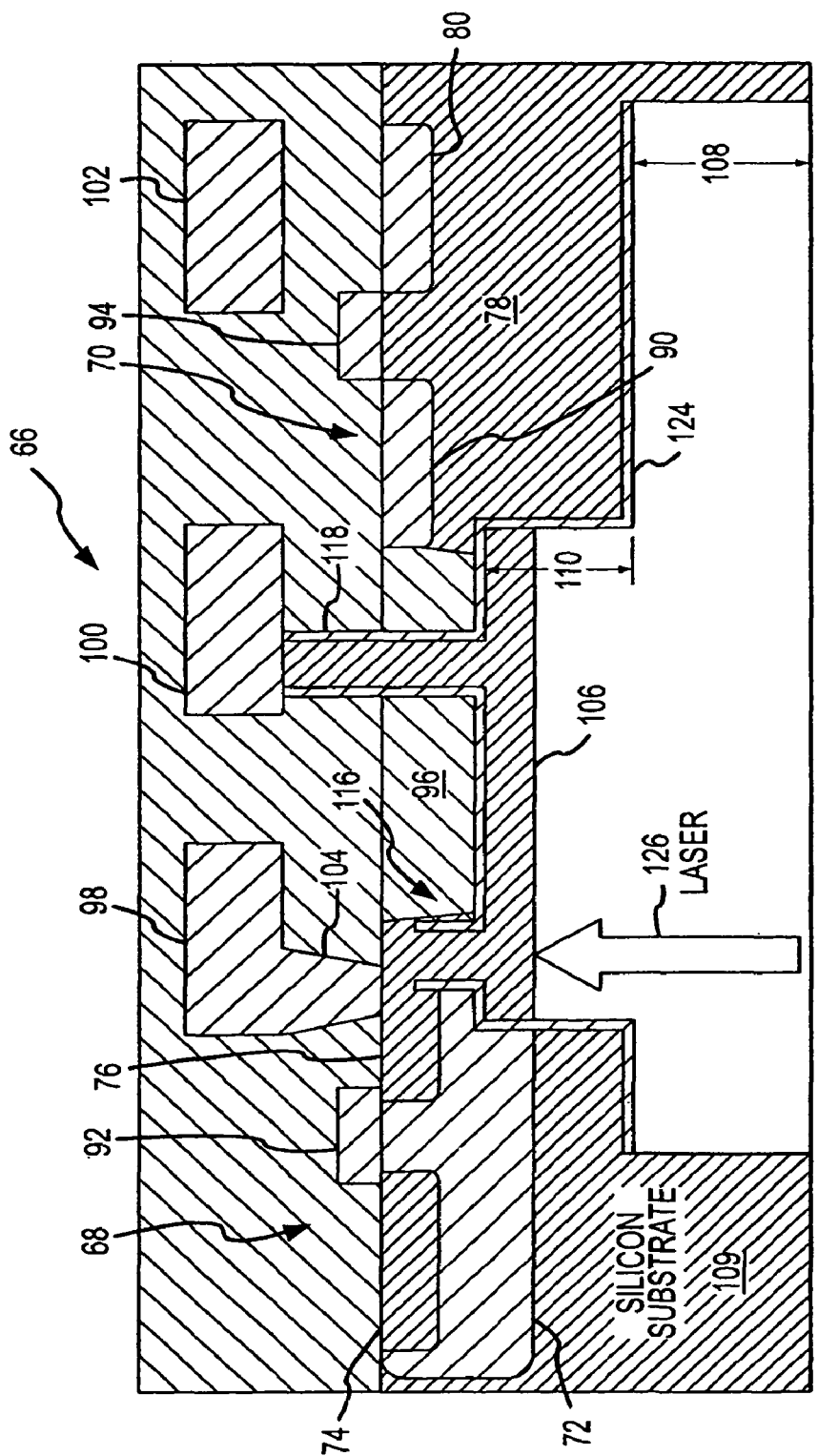
FIG. 4 is a schematic section view of an integrated circuit illustrating a laser being used to form a silicide in a contact region between a deposited conductor and a diffusion region of a transistor, in accordance with one embodiment of the present invention.

FIG. 4 is a schematic diagram of a target portion 66 of an example IC, with a P-FET transistor 68 and N-FET transistor 70 defined in a shallow trench isolation ("STI") configuration. As with the arrangement in FIG. 2, the P-FET transistor includes an n-well 72 with two p-diffusion regions (source 74 and drain 76). The N-FET employs the p-type substrate as a well 78, and includes n-diffusion regions (source 80 and drain 90). Additionally, each transistor arrangement includes a gate (92, 94) between the respective drain and source. The STI region 96 forms an insulator (SiO$_2$) between the two transistors. Three M1 interconnects (98, 100, 102) are shown. A contact 104 provides a connection between the left M1 link 98 and the drain 76 of the P-FET. In the example circuit editing procedure discussed below, a conductive pathway 106 is defined between the p-diffusion region (drain) of the P-FET and the middle M1 interconnect 100.

To properly orient and deposit the conductor in the correct location, a series of trenches are defined in order to identify the target structures and define node access holes to the target structures. A global trench 108 is defined in the substrate 109 beneath both transistors. As mentioned above, the global trench may be used to image an area of an IC to identify particular target structures. A second global trench or local trench 110 of a width less than the global trench is defined between the target p-diffusion region 76 of the P-FET transistor 68 and the STI region 96 between the transistors, and below the target metal interconnect 100.

To avoid damaging IC structures, it is important to carefully control the depth and surface areas of a trench. The top of the local trench 110 (i.e., the milling depth) may be identified by detecting the boundary between the substrate 109 and the STI 96, which process may be generally referred to as one method "endpointing." The term "endpointing" is often used generally to refer to the process of determining when to stop a FIB milling operation at a certain depth. The substrate is primarily silicon (Si) whereas the STI area is primarily silicon dioxide (SiO$_2$). This material difference between the substrate and STI may be detected with a FIB tool. Some FIB tools include a secondary electron detector, such as a scintillator and photo multiplier arrangement, for detecting secondary electrons emitted due to impingement of a focused ion beam. The detected secondary electrons are converted into an image. The number of secondary electron emissions are typically a function of the material being processed with the FIB beam. As such, in a secondary electron image of the local trench, secondary electron emissions differences between silicon and silicon dioxide may be detected. Thus, the depth and width of the local trench may be managed by detection of the boundary between the silicon substrate and the STI. In the example of FIG. 4, upon detection of the drain/STI boundary, milling of the local trench is halted.

Figures 5A, 5B:
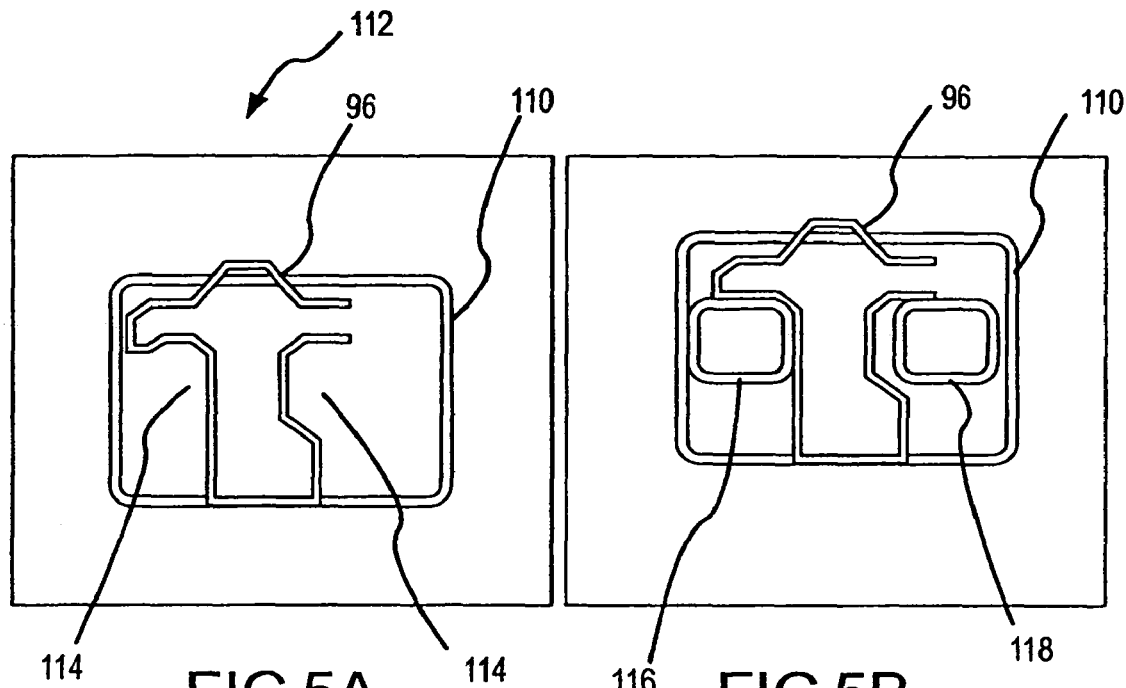
FIG. 5A is a representative focused ion beam image of an endpointing operation on the IC of FIG. 4, in accordance with one embodiment of the present invention.
FIG. 5B is a representative focused ion beam image of an endpointing operation of FIG. 5A further illustrating node access holes, in accordance with one embodiment of the present invention.
Figure 5C:
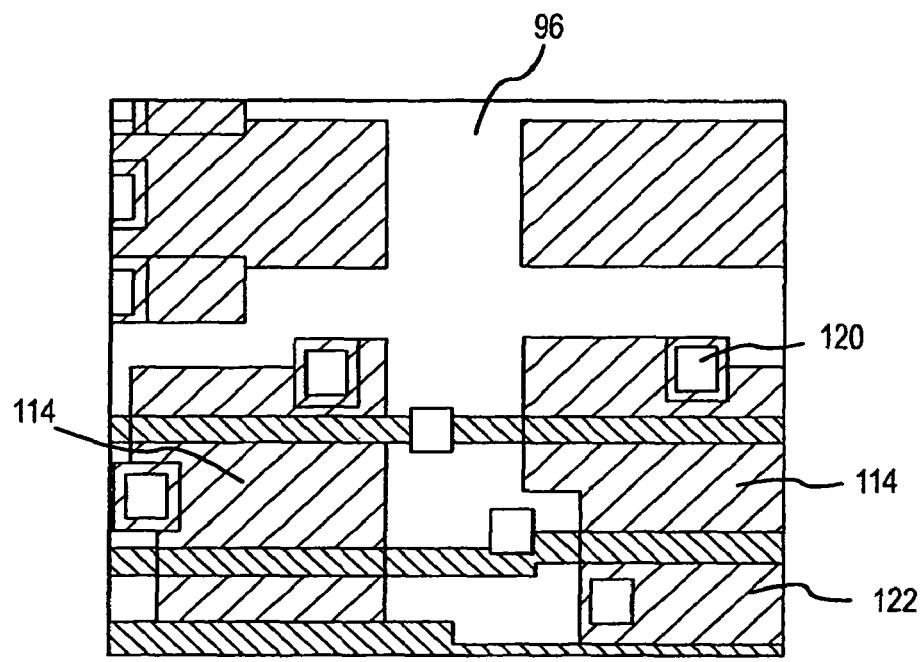
FIG. 5C is computer-aided-design layout of the portion of the integrated circuit being imaged in FIGS. 5A and 5B.

FIG. 5A is a representation of a FIB image 112 of the STI area 96 of FIG. 4 bounded by diffusion areas 114 and a local trench 110 similar to the IC schematic of FIG. 4. FIG. 5B is a representative FIB image of the IC structure of FIG. 5A with two node access holes (116, 118) of FIG. 4 (discussed further below). Finally, FIG. 5C is a layout diagram of an IC corresponding to the representative IC FIB image of FIG. 5A. The layout includes the STI region 96, diffusions 114, contacts/vias 120, and metal 1 interconnects 122. A visual comparison between the representative image of FIG. 5A and the IC layout of FIG. 5C shows the degree of accuracy an overlay of a FIB image over a device layout can achieve. Through the overlay, the node access hole milling locations (116, 118, see FIG. 5B) to the target structures can be positioned precisely, such as through alignment of the FIB beam with the image.

The endpointing process originates in the STI depth of usually below 500 nm as is illustrated in FIG. 5A. When a contrast in the FIB image appears (between the T-shaped STI area and the adjacent diffusion regions), the FIB trench is typically generated to some depth within the wells. As shown in FIG. 4, the local trench is about halfway into the well of the P-FET. Thus, when a contrast is recognized, milling of the local trench 110 is complete. It is important to carefully monitor trench definition so that the proper electrical function of the IC is maintained, which may depend on a variety of parameters like trench bottom flatness, mechanical stability, electrical integrity of the wells and device degradation. For failure analysis purposes the contrasts can show the existence and position of the structures without any further sample preparation. The local trench endpoint, very close to the diffusion layer, is one starting condition for direct contact to active devices in silicon (i.e., node access hole definition) because the editing trench depth can be calculated accurately.

Endpointing may also be achieved through a variety of other techniques. For example, monitoring an optical, electron or ion beam induced current through a pn-junction in the substrate can also provide endpoints, such as is described in U.S. Pat. No. 6,355,494 titled "Method and Apparatus for controlling Material Removal from a Semiconductor Substrate Using Induced Current Endpointing" by R. H. Livengood et al., issued Mar. 12, 2002 which is hereby incorporated by reference herein. The boundary between the substrate and an inversely doped well or active diffusion region can be determined using active voltage contrast, if a bias voltage is applied between the substrate and the well or diffusion, such as in the method discussed in U.S. Pat. No. 5,948,217 titled "Method and Apparatus for Endpointing While Milling an Integrated Circuit" to Winer et al., issued Sep. 7, 1999, which is hereby incorporated by reference herein. A similar image contrast for the N-Wells can also be obtained without the need of biasing or contacting the device apart from grounding, such as is described in "Voltage Contrast Like Imaging of N-Wells" by C. Boit et al., Proc. $29^{th}$ ISTFA (2003).

Referring again to FIG. 3, after definition of the local trench, one or more node access holes are defined to the target structures (operation 320). The node access holes provide a conduit to the target structures for later deposition of a conductor. With respect to the particular example circuit editing of FIG. 4, a first node access hole 116 is defined between the local trench 110 and p-diffusion region (drain) 76 of the P-FET transistor. Additionally, a second node access hole 118 is defined between the local trench 110 and the middle M1 interconnect 100.

The node access hole milling location may be determined by comparing and aligning the CAD layout for an IC (see, for example, FIG. 5C) with a FIB or optical image of a target region of the IC (see, for example, FIG. 5A). Similar to as discussed above, the global trench, local trench, and node access holes are coated with an insulator, using a FIB tool, in one particular implementation (operation 330). In the example of FIG. 4, an insulator 124 is deposited in the node access holes (116, 118), along the local trench 110, and the global trench 108. It may be necessary to reopen the node access holes with a focused ion beam after the insulator deposition. Next, a conductor is deposited to form a conductive trace to one or more target circuit editing structures (operation 340). In the example of FIG. 4, to form an electrical path between the drain 76 of the P-FET and the middle M1 interconnect 100, the conductor 106 is deposited in the two node access holes (116, 118) and along the local trench 110 therebetween. The conductor may be deposited using a FIB tool as discussed herein.

After deposition of the conductor, a laser or other local heating source (alone or in combination) may be employed to locally heat the conductor adjacent the interface between the conductor and the target active structure (operation 350). Local heating or annealing of the conductor adjacent the target semiconductor structure facilitates silicide formation at the boundary therebetween. The localized heat to form a silicide is dependent on the conductor and other issues such as the thermal conductivity of the adjacent structures. As referenced above, platinum or tungsten based silicides typically require a temperature of between 450° C. and 600° C. for silicide formation, although other temperatures may be required. It is also possible to locally heat the target semiconductor, before conductor deposition, and then deposit the conductor on the heated surface while it is still at a temperature appropriate for silicide formation.

Referring to FIG. 4, in one particular implementation of the present invention, a laser 126 is employed to heat the FIB-deposited conductor to locally form silicides at the conductor/diffusion boundary. The laser may be pulsed or continuous, depending on any particular specific implementation. The heating wavelength of the laser may be ultraviolet, visible, or infrared. Examples of possible laser types to employ include a 308 nm excimer laser, 488 nm ion laser, 337 nm nitrogen laser, 10.6 µm $CO_2$ laser, and 1064 nm Nd:YA6 laser.

In the example of FIG. 4, the laser 126 is applied to the conductor 106 for localized silicide formation. The laser is applied to the conductor at a point away from the conductor boundary with the target diffusion region 76. The deposited conductor material then conducts heat toward the interface between the conductor and the target semiconductor structure. In such an application, silicide is formed along the conductor between the spot where heat is applied and the boundary with the target semiconductor structure. The time required to form silicide will depend on the thermal conductivity of the conductor material, the volume of the conductor material, heat transfer to adjacent material, and other factors.

Figure 6:
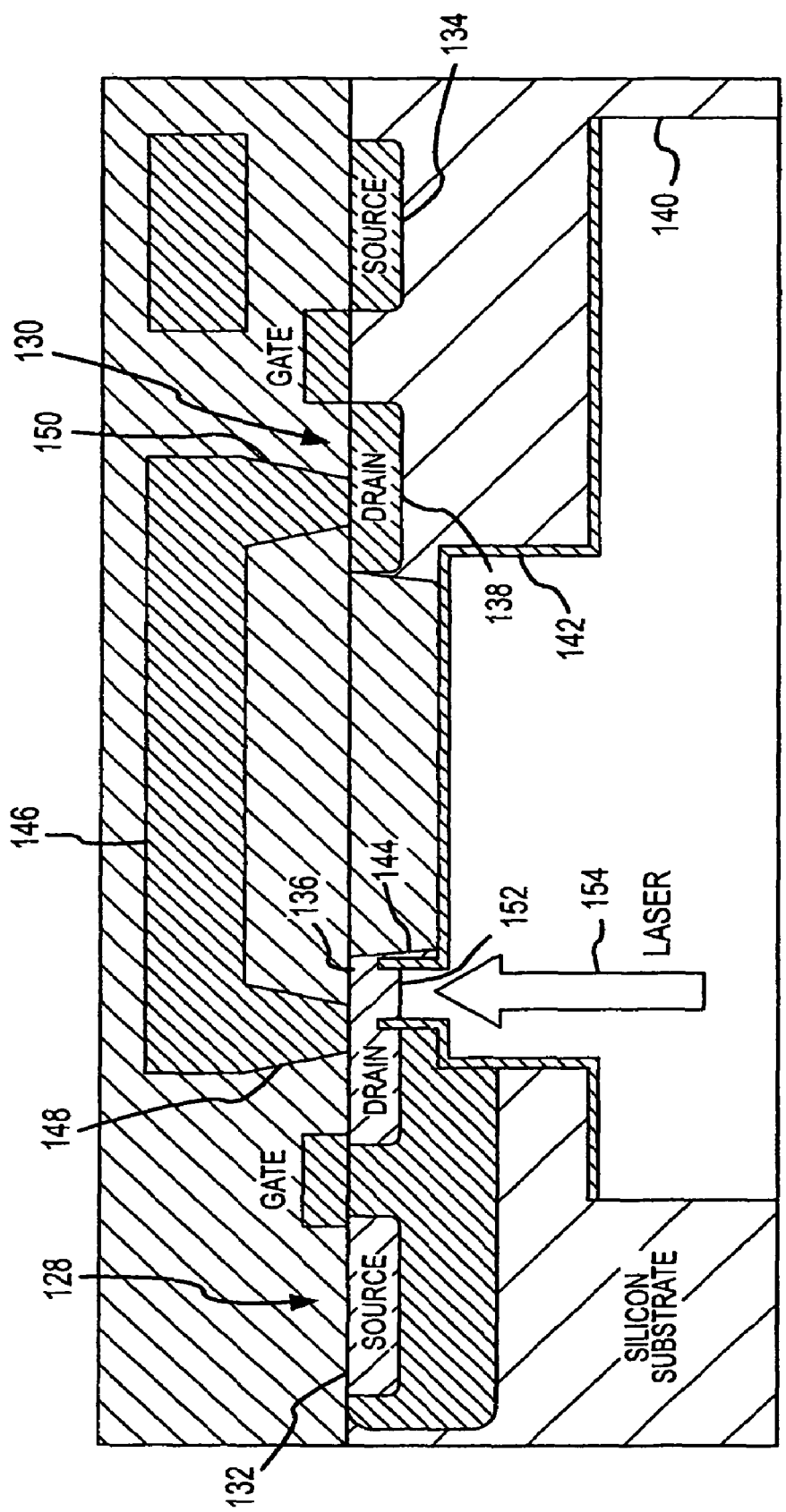
FIG. 6 is a schematic section view of an integrated circuit illustrating a laser being used to form silicide in a contact region between a deposited conductor and a diffusion region of a transistor, where only a discrete portion of the conductor has been deposited, in accordance with one embodiment of the present invention.

Referring now to FIG. 6, an alternative application of localized heat to form silicide is shown. The IC structure of FIG. 6 is similar to others discussed herein (e.g., FIGS. 2 and 4) and indicates P-FET 128 and N-FET 130 transistor structures with source (132, 134) and drain (136, 138) diffusions. Additionally, a global trench 140 and a local trench 142 are shown. In the FIG. 6 example, one node access hole 144 is shown (from the local trench 142 to the drain 136 of the P-FET). Additionally, a link 146 is shown between the drain of each transistor. The link comprises a contact 148 between the P-FET drain and an M1 interconnect 146, and a contact 150 between the N-FET drain and the M1 interconnect.

In the FIG. 4 example, localized heat is applied after the conductor trace is fully deposited. Alternatively, in the FIG. 6 example, a small amount of conductor 152 is deposited in the node access hole 144. The conductor is in contact with the target semiconductor structure 136. Then, a laser 154 is applied to the discrete conductor portion to form silicide therein. After silicide formation, the remaining conductor may be deposited. In such an implementation, silicide formation occurs more quickly and in only a discrete portion of the deposited conductor adjacent the target structure (as compared with the example of FIG. 4).

Figure 7:
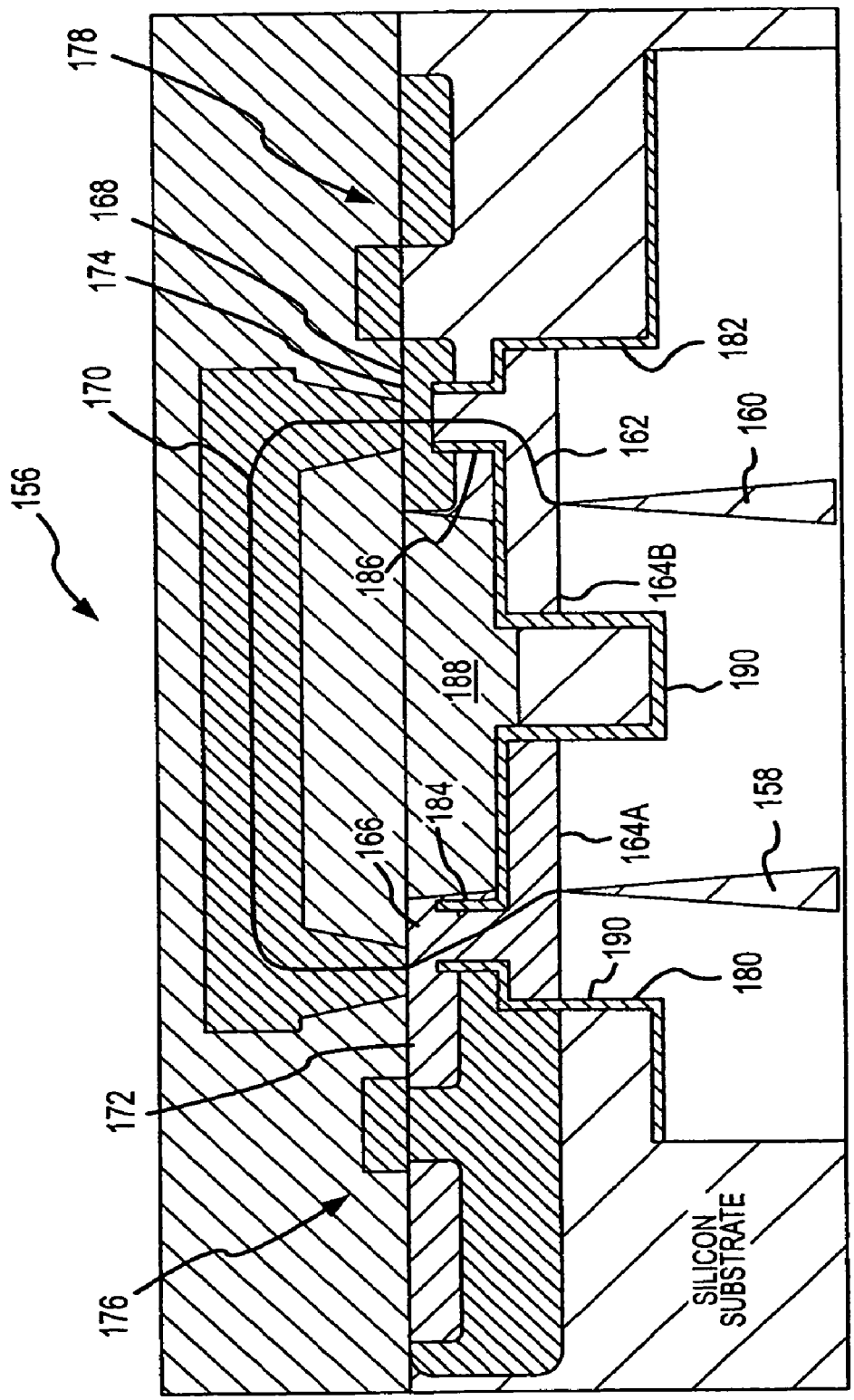
FIG. 7 is a schematic section view of an integrated circuit illustrating a first and second probe tip being used to create an electrical current path to generate joule heating to form silicide at the interface between a conductor and a diffusion region of a transistor.

FIG. 7 is a schematic diagram of a portion of an IC 156 wherein two probes (158, 160) are employed to provide a current path 162 in order to locally heat a conductor (164A, 164B) adjacent target semiconductor structures (166, 168), in conformance with one particular implementation of the present invention. The current flow through the conductor causes localized joule heating at the conductor location adjacent the target semiconductor structures (contact) and elsewhere for silicide formation. In the IC circuit editing example of FIG. 7, a M1 layer conductive pathway 170 extends between the drain diffusion regions (172, 174) of respective P-FET 176 and N-FET 178 transistors (an inverter configuration).

Unlike the FIG. 4 example, two separate local trenches (180, 182) are defined below the drain diffusion regions of each transistor. Additionally, a first node access hole 184 extends between the first local trench and the p-diffusion drain region of the P-FET transistor and second node access hole 186 extends between the second local trench and the n-diffusion drain region of the N-FET transistor. Between each local trench, a portion of the substrate 188 remains. This portion of the substrate (STI) provides an insulating barrier between the first and second local trenches. An insulator 190 is deposited in the node access holes, local trenches, and global trench. A conductor 164A is deposited in the first local trench and first node access hole. Additionally, a conductor 164B is deposited in the second local trench and the second node access hole. Due to the remaining substrate 188 between each local trench, the deposited conductor in the first and second local trenches are electrically isolated. Polishing, etching, or other procedures may be required to remove conductor material deposited on the remaining substrate portion. The depth of the local trenches may be guided by the endpoint detection routines discussed above detecting the boundary between the silicon and silicon dioxide STI area.

To locally heat the conductors adjacent the diffusion regions of each transistor, the first probe 158 and a second probe 160 are inserted into each local trench (180, 182) to form an electrical connection with the conductors (164A, 164B) therein. By applying a first bias at one probe tip and a ground or different bias at the opposing probe tip, the electrical current 162 flows between the probe tips through the deposited conductors, through the diffusion regions (166, 168) and through the M1 pathway between the transistors. Through joule heating, the current flow locally heats the boundary between the conductor and the diffusion regions to form silicide. In one particular circuit editing operation, a DC current of about 10 mA/µm$^2$ for 50 milliseconds may be applied to a deposited platinum conductor for proper silicide formation at the target contact area. The amount of time for application of a current will depend on the heat capacity of the deposited conductor, the electrical current, and other factors. In another example, a 2 MA current is applied to a platinum conductor for 10 seconds for localized solicitation formation. In some implementations, a contact resistance of between 10Ω and 30Ω may be achieved when a localized silicidation formation technique, conforming to the present invention, is applied.

Figure 8:
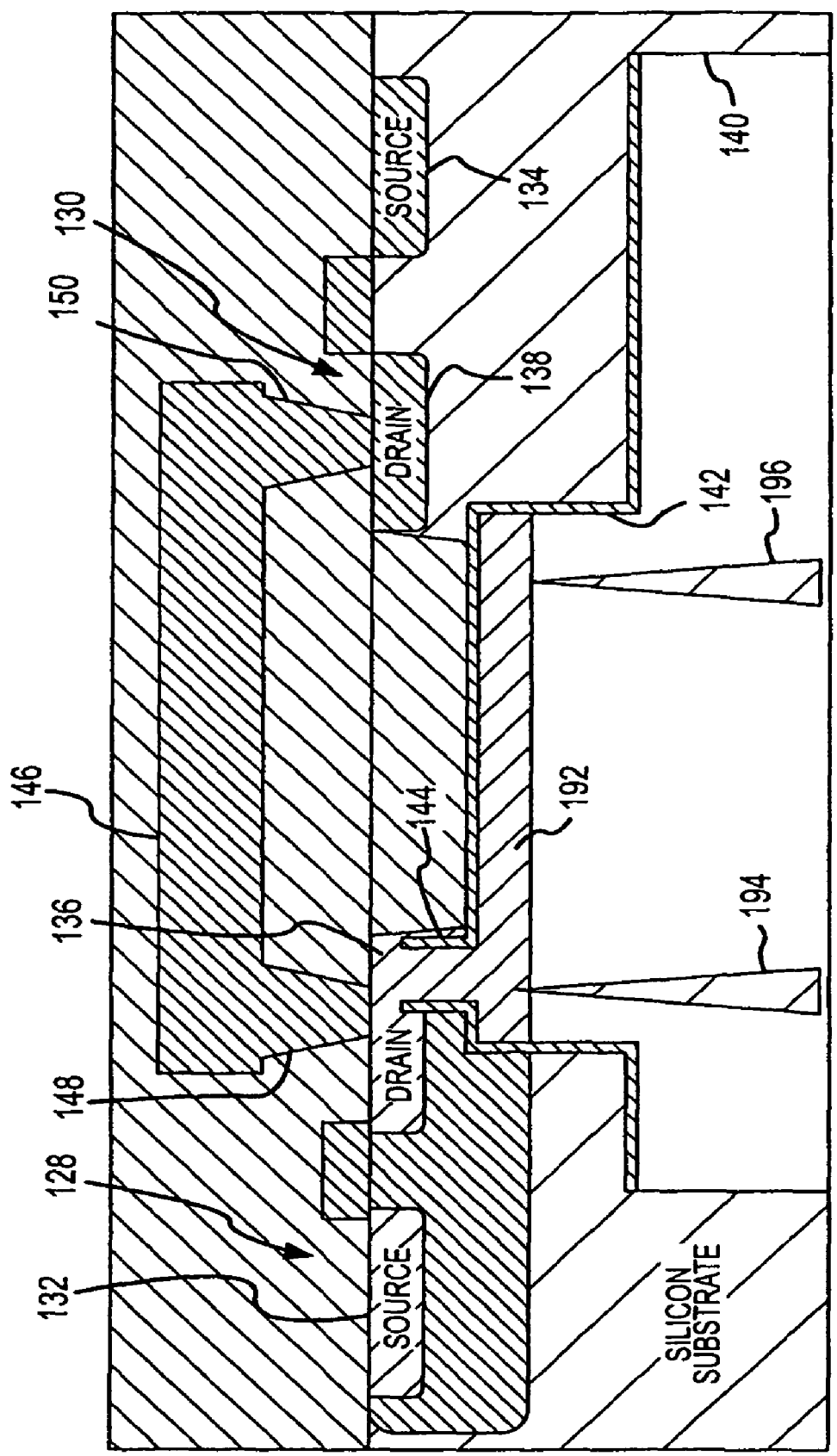
FIG. 8 is a schematic section view of an integrated circuit illustrating probe tips being used to create a current path through a deposited conductor to generate joule heating to form silicide at the interface between a conductor and a diffusion region of a transistor.

The example circuit of FIG. 8 is the same as FIG. 6. However, the example circuit editing and silicide formation shown in FIG. 8 employs joule heating in a manner similar to FIG. 7. Unlike FIG. 7, in the example of FIG. 8, separate trenches and a conductive pathway through the M1 layer are not employed. Rather, a conductor 192 is deposited between the node access hole 144 to the N-FET drain 136 and along the local trench 142. A probe tip 194 is then placed in electrical contact with the conductor near the node access hole and a second probe tip 196 is placed in electrical contact with the conductor at another location. A potential difference is then applied between the probe tips to cause joule heating in the conductor. With sufficient time, suicide is formed at the contact between the P-FET drain 136 and conductor 192, as well as in other portions of the deposited conductor.

Figure 9:
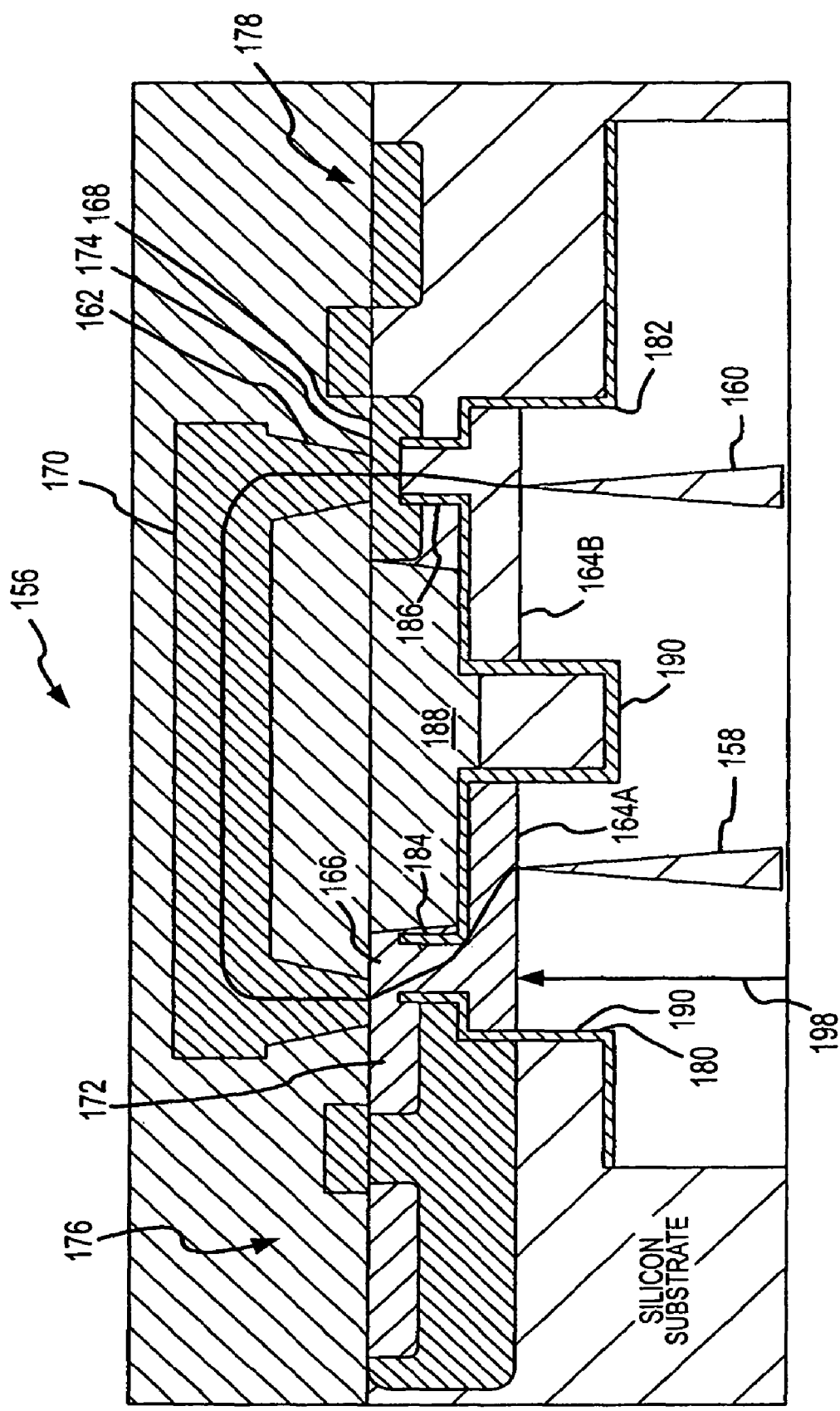
FIG. 9 is a schematic section view of an integrated circuit similar to FIG. 6 except that a laser is being applied to a conductor, in conjunction with a current conduction arrangement, adjacent the diffusion region of a transistor to locally form a silicide.

The example silicide formation technique illustrated in FIG. 9 employs the joule heating technique discussed with respect to FIG. 7 in combination with laser heating. The circuit example, trench configuration, conductor deposition, etc., is the same as FIG. 7. In addition to the current based localized heating, a laser 198 may also be employed to further heat the target area for silicide formation in a conductor connection with a target semiconductor structure. This combination of joule heating and laser heating allows a lesser power laser to be employed as compared when a laser is employed without attendant joule heating, which can help to reduce the heat transfer into areas adjacent the target area which might cause damage to the local structures.

Figure 10:
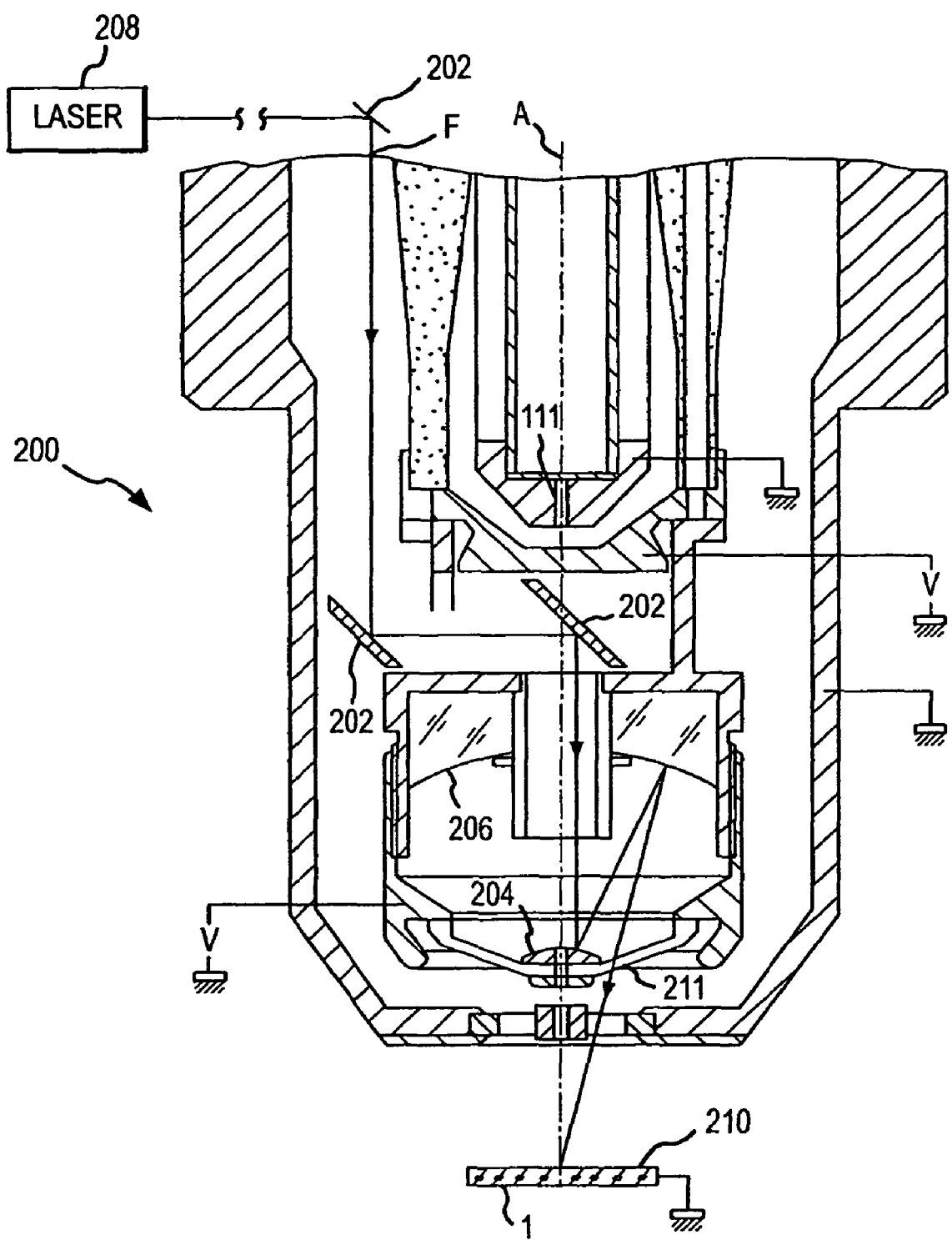
FIG. 10 is a section view of a focused ion beam column employing a coaxial laser beam arrangement in order to apply a focused ion beam and a laser beam at the same point on an integrated circuit when performing a method in accordance with the present invention.

FIG. 10 illustrates a portion of a dual column focused ion beam tool 200, otherwise described in U.S. patent application Ser. No. 10/239,293 (Publication No. US2003/0102436) titled "Column Simultaneously Focusing a Particle Beam and an Optical Beam" filed on Mar. 19, 2001 (the '293 application), which is hereby incorporated by reference herein. In various methods conforming to the present invention, a laser is directed to a target location in an IC during a circuit editing operation in order to locally form silicides at the conductor semiconductor boundary. The dual column arrangement of the '293 application includes a focused ion beam path A and an optical path F. The optical path includes mirrors (202), a convex mirror 204, and a concave mirror 206 adapted to convey an optical beam to and from an integrated circuit.

In one modification of the dual column arrangement, a laser assembly 208 is optically coupled to the existing optical path F. Depending on a particular implementation, fiber optical paths, collimating lens arrangements, beam splitters, and other optical components (not shown) may be employed to couple the laser to the existing optical path. When activated, the laser follows the optical path F and is incident on the target location of the integrated circuit 210. Alignment of the optical path with the target path may be achieved through imaging the surface of the target area of the IC and properly aligning the image so that the laser impinges the target area.

Figure 11:
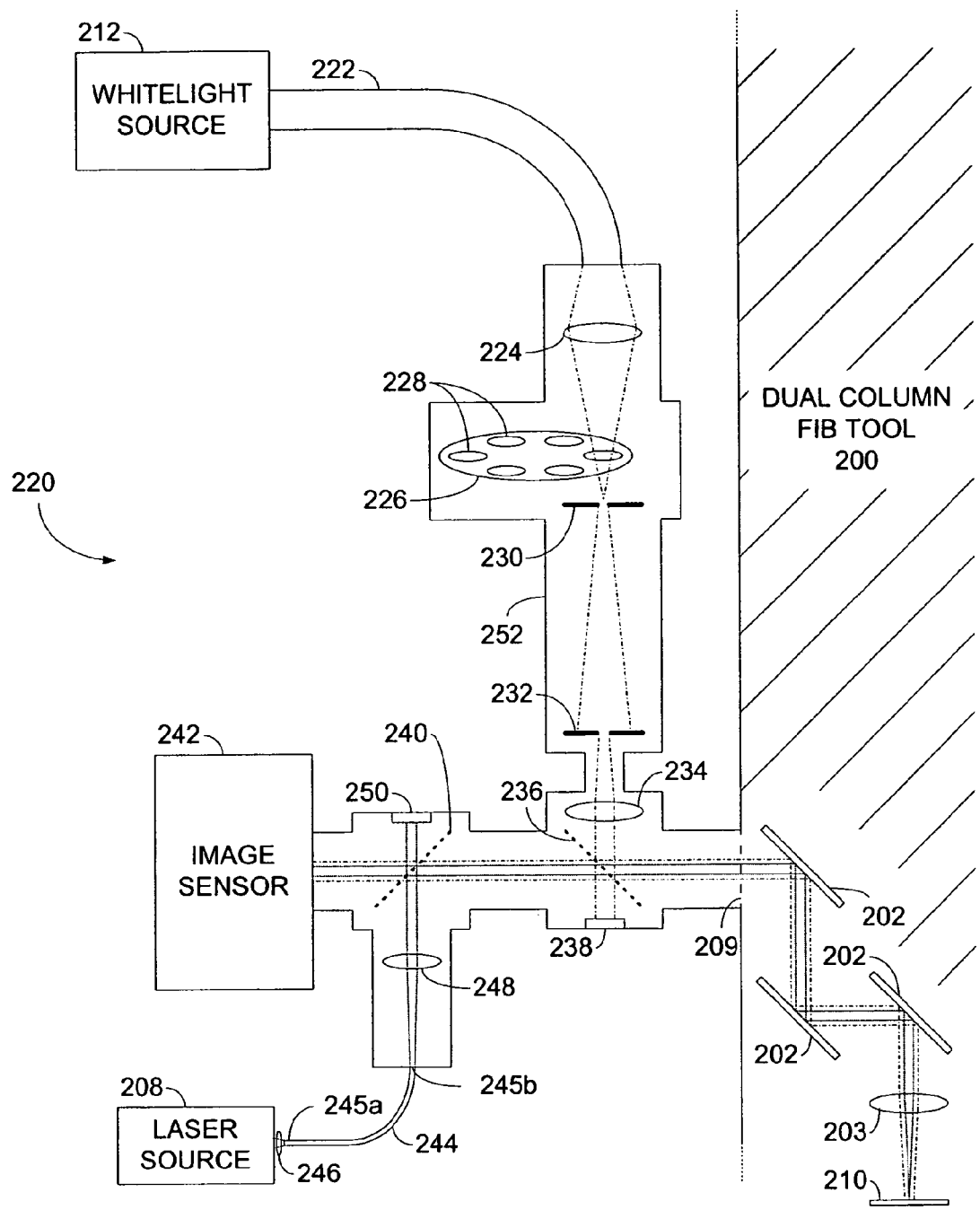
FIG. 11 is a schematic diagram of an optical coupling apparatus in accordance with the present invention for the focused ion beam column of FIG. 10, the configuration employing a laser source for localized heating, and a whitelight source for imaging.
Figure 12:
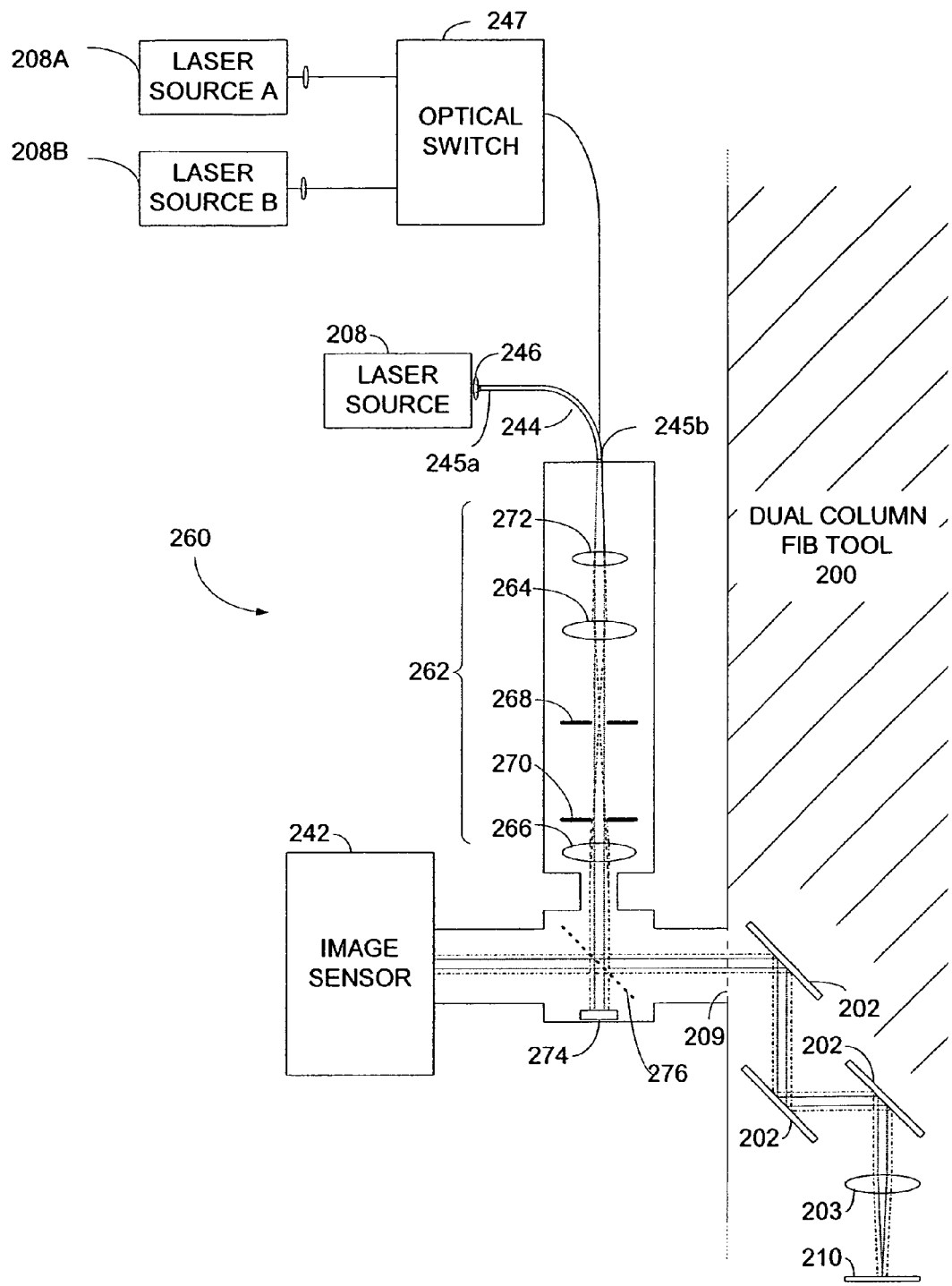
FIG. 12 is a schematic diagram of an optical coupling apparatus in accordance with the present invention for the focused ion beam column of FIG. 10, the configuration employing a single laser source allowing localized heating and standard microscopy-type imaging.
Figure 13:
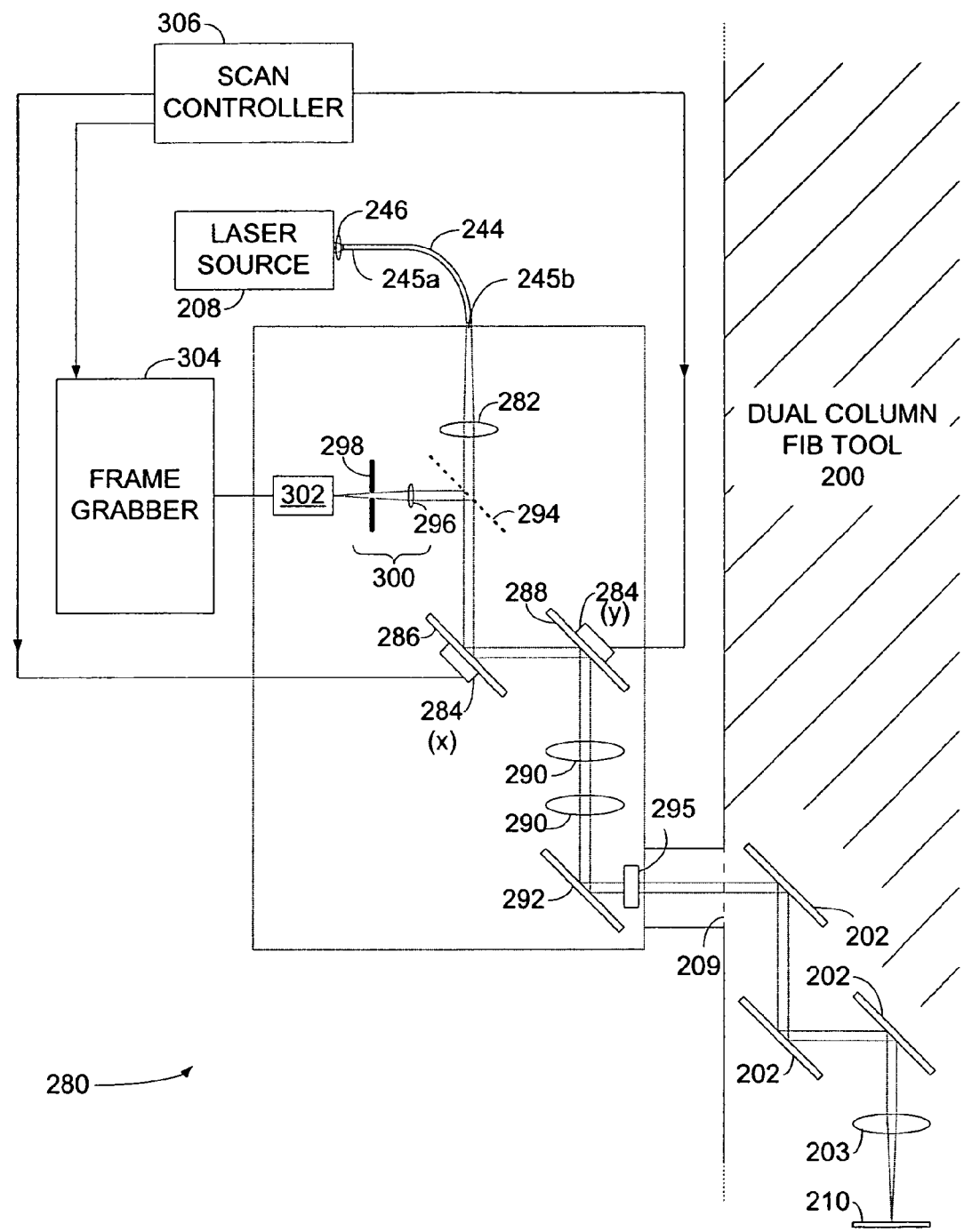
FIG. 13 is a schematic diagram of an optical coupling apparatus in accordance with the present invention for the focused ion beam column of FIG. 10, the configuration employing a single laser source allowing localized heating and confocal scanning microscopy-type imaging.

FIGS. 11, 12 and 13 each depict different embodiments of a dual column focused ion beam tool employing a coupling assembly for optically coupling a laser with the focused ion beam tool for the formation of localized silicide in a target area of an IC. The focused ion beam tool includes an optical path F and a focused ion beam path A (best shown in FIG. 10). An optical coupling assembly couples laser light from the laser to the optical path F. In each embodiment, a set of mirrors 202 and an objective lens 203 within the dual column arrangement direct both illumination and imaging light for area imaging of the IC 210, as well as more focused laser light for silicide formation. The illumination/imaging light and laser light follow substantially the same path through the dual column both to and from the IC 210.

Various specific dual column arrangements are possible, and no specific arrangement is required for any of the embodiments of the invention. For example, while three mirrors 202 are presented in the dual column charged particle beam tool shown in FIGS. 10-13, more or fewer mirrors may be employed in alternative dual column designs. Further, while the objective lens 203 may employ the convex mirror 204 and concave mirror 206 shown in FIG. 10, other objective lens arrangements may be employed to similar end. In addition, the optical coupling apparatus described below may be employed with other devices providing an optical coupling with an integrated circuit to be heated and imaged.

FIGS. 11, 12 and 13 each illustrate alternative optical coupling apparatuses schematically. In each arrangement, sizes or lengths shown for the lenses, mirrors, or any other components depicted are not intended to portray actual dimensions or distances to scale. Also, any light rays shown are not intended to provide an accurate view of the rays and associated angles expected from the embodiments illustrated, and are supplied for instructional purposes only.

A particular advantage of one particular implementation of the optical coupling apparatuses described below is that each may be employed with little or no internal modification of the dual column tool 200, as each uses a single port 209 of the column, through which both illumination and imaging light, and laser heating light, are directed to and from the IC 210 being processed. Referring to the embodiment of FIG. 11, an optical coupling apparatus 220 combines a "flood" illumination and imaging configuration typically associated with the optical functionality of a dual column FIB tool, with a laser employable to heat localized areas of an IC 210 to form silicide. Generally, a laser source 208 (for heating) and a whitelight source 212 (for illumination) are coupled together via the optical coupling apparatus 220, which form an embodiment of a dual column tool 200 using a single port 209 to facilitate local formation of silicide within an IC 210.

The whitelight source 212, which may be, for example, a xenon (Xe) or halogen lamp, is optically coupled by way of a fiber bundle 222 to a condenser lens 224. The fiber bundle 222 provides a conduit by which the light emitted by the whitelight source 212 is transmitted to the condenser lens 224. The condenser lens 224 converges the light received from the fiber bundle 222 onto an aperture stop 230 which controls the size of illumination source. Generally, an aperture stop defines an aperture residing within an opaque screen. Typically, the aperture stop 230 is embodied as an adjustable iris mechanism which provides an aperture of a user-selectable diameter through which the beam passes. Aperture stop 230 is located at the image plane of the fiber source. The aperture stop 230 thus adjustably limits the size of the illumination source, and thus the brightness, of the beam. Brightness control aids in imaging a variety of IC structures and surfaces, each possessing its own reflectivity characteristics.

The illumination beam passes through a selectable bandpass filter 226. Typically, the optical bandpass filter 226 takes the form of a filter wheel 226, about which one or more filter windows 228 are provided, with each window 228 allowing the passage of a different portion of the wavelength spectrum exhibited by the light beam. To select a particular filter window, the filter wheel 226 is rotated so that the desired window 228 lies within the light beam from the condenser lens 224. The selectable nature of the optical filter wheel 226 allows the use of diverse light wavelengths in an effort to provide high contrast images of the various features of the IC 210 being imaged. In alternative embodiments, the optical bandpass filter may not be selectable, thus permitting a predetermined portion of the wavelength bandwidth to pass therethrough. In still other embodiments, no bandpass filter may be employed, thus allowing all of the particular light source to pass.

After exiting the aperture stop 230, the light beam encounters a field stop 232. In one embodiment, the field stop 232, similar in structure to the aperture stop 230 described above, provides an iris of adjustable diameter. Field stop 232 resides at the conjugate of the sample image plane. As a result, the field stop 232 provides a mechanism which controls the size of the resulting image of the IC by ultimately controlling the amount of IC area being illuminated. The field stop 232 is an important component to baffle the illumination light in order for high-contrast imaging. Alternatively, the field stop 232 may not be adjustable, thus making the resulting image size fixed.

Upon exiting the field stop 232, the light beam is focused by a field lens 234, which transmits the image source from the aperture stop 230 onto an exit pupil of the objective lens 203. This arrangement, commonly known as a Kohler illumination scheme, ensures uniformity of image brightness.

The illumination beam then encounters a first beam splitter 236, which represents the first point at which the path of the illumination beam joins with the path of the laser beam, the generation of which is discussed in greater detail below. The first beam splitter 236 is adapted to direct a portion of the illumination beam through the port 209 of the dual column tool 200, after which the beam is directed toward the IC 210, such as by way of the one or more mirrors 202, and the objective lens 203. That portion of the collimated illumination beam not directed by the first beam splitter 236 toward the port 209 of the dual column tool 200 passes through the first beam splitter 236 and impinges a beam trap 238, which substantially prohibits reflection of that portion of the collimated illumination beam toward any other portion of the optical path of the optical coupling apparatus 220.

A portion of the illumination beam is then reflected from the IC 210, the resulting reflected light being characterized as an imaging beam, which imparts information concerning structural and compositional features of the IC 210 illuminated by the illumination beam. The imaging beam from the IC is collected and directed by the objective lens 203 toward the one or more mirrors 202, which direct the imaging beam toward the port 209 of the dual column tool 200.

Upon exit from the dual column tool 200, the imaging beam encounters the first beam splitter 236, which is configured to allow part of the imaging beam to pass therethrough. Thereafter, the imaging beam passes through a second beam splitter 240, which is employed to direct laser light from the laser source 208, as described below. The second beam splitter 240 is adapted to allow the imaging beam to pass therethrough with minimized loss. The imaging beam is then captured by an image sensor 242, such as a charge-coupled device (CCD) camera, a focal plane array (FPA) camera, or a CMOS camera, which produces an electronic image of the illuminated portion of the IC 210 from the imaging beam.

Coupled with the optical path of the illuminating and imaging beams is a laser path for laser light generated from the laser source 208. The laser source 208 may be a gas laser, such as an excimer laser, an ion laser, a solid state laser, such as Nd:YAG laser, a semi-conductor laser, or a fiber laser.

The laser light from the laser source 208 is coupled to an optical fiber 244, typically by way of a fiber coupling lens 246, which directs most of the laser light from the laser source 208 into a first end of the optical fiber 244. Ordinarily, the beam size produced by the laser source 208 is wider than the core of the optical fiber 244, thus requiring the fiber coupling lens 246 to focus the laser light into the first end of the optical fiber 244. The optical fiber 244 carries the laser light to a second end of the optical fiber 244, at which point the laser light exits the fiber 244.

The laser light emitted from the second end of the optical fiber 244 may be substantially divergent in nature due to internal reflections of the light within the optical fiber 244. Thus, after exiting the fiber 244, the laser light encounters a collimating lens 248, which re-shapes the laser beam at divergent angles so that the focused spot on the sample plane 210 is controllable.

The laser path carrying the laser beam aligns with the optical path of the imaging beam so that the laser beam and the illumination and imaging beams may all enter the dual column via the same port. More specifically, the collimating lens 248 directs the laser beam toward the second beam splitter 240, which is configured to direct most of the laser beam toward the first beam splitter 236. That portion of the laser beam not directed toward the first beam splitter 236 typically passes through the second beam splitter 240 toward a beam trap 250, which substantially prohibits reflection of light from the trap 250. The first beam splitter 236 allows the majority of the laser beam to pass therethrough to the port 209 of the dual column tool 200. Again, a substantial portion of the laser beam that does not pass through the first beam splitter 236 is captured by the beam trap 238 associated with the first beam splitter 236.

Once the laser beam enters the port 209 of the dual column tool 200, the one or more mirrors 202 direct the collimated laser beam to the objective lens 203, which focuses the beam, directed onto a small area of the IC 210 to be heated. The tightness of focus (or spot size) is controlled by the collimation lens 248. The laser light follows substantially the same optical path as the illumination and imaging light. As such, proper steering of the laser beam (mainly by second beam splitter 240) to the center of the image field of view causes proper alignment of the laser. In one particular embodiment, the laser beam creates a spot size of approximately 2 microns (μm) full-width at half-maximum (FWHM). Such a beam size is generally considered appropriate in many situations for heating localized portions of the IC 210 under process to cause silicide formation.

In one embodiment, an opaque enclosure 252 is employed throughout the laser path and the illumination and imaging paths of the optical coupling apparatus 220 to protect the paths from ambient light, particulate matter, and other contaminants that may adversely affect the various components of optical coupling apparatus 220, or the illuminating and imaging beams and the laser beam themselves.

By coupling the laser, illumination and imaging paths in such a manner, more optical components are introduced into each path, thereby introducing possibly higher transmission losses than what may be experienced with a single optical path, thereby resulting in overall lower light intensity. If the transmission efficiency of the path carrying the laser beam is approximately 20%, and the efficiency of the dual column is approximately 20%, a 200 milliwatt (mW) laser delivers approximately 200 mW×20%×20%, or 8 mW of power to the IC. Assuming a laser beam spot size of 2 μm, as determined in part by the collimating lens 248, a continuous power density or intensity of 8 mW/($\pi \times (1 \mu m)^2$), or approximately 0.25 megawatts per square centimeter (MW/cm$^2$) is produced, which is considered adequate to allow the impacted portion of the IC 210 to absorb a sufficient amount of heat energy to provide silicide formation. In an alternative embodiment, a pulsed laser may be employed in lieu of a laser source providing continuous laser light. A pulsed laser typically has a pulse time much shorter than the rate of thermal conduction. Thus, the heat generated by a pulsed laser tends to appear on the surface layer and the temperature tends to be higher. The power requirement from pulsed laser usually is lower than a continuous laser.

In relation to the imaging beam, coupling of the laser, illumination and imaging paths may reduce the intensity of the image received by the image sensor 242 when compared to other possible optical paths. However, increasing the intensity or brightness of the whitelight source 212, or increasing the exposure time of the image sensor 242, substantially alleviates problems relating to image brightness.

By providing separate whitelight and laser sources, the embodiment of FIG. 11 allows the flexibility of simultaneous imaging of an area of the IC 210 by way of the whitelight source during heating of a small portion of the imaged area for localized silicide formation via the laser source.

FIG. 12 illustrates another embodiment of a focused ion beam tool employing a laser assembly for silicide formation within a target IC. The FIB tool includes an optical coupling apparatus 260, employing a single laser source as both an illumination light source and a laser light heating source. In a fashion similar to the embodiment of FIG. 11, a laser source 208 is coupled to a first end of an optical fiber 244. When different wavelengths are needed for imaging, an optical switch 245 may be employed to couple several laser light sources (208A, 208B) (laser or LED) of different wavelengths to a single fiber and select among them. A fiber coupling lens 246 serves to converge the laser light sufficiently to enter a first end of the optical fiber 244. The laser light then travels the length of the optical fiber 244 and exits a second end of the fiber 244.

The laser light then enters a configurable laser light converter 262 capable of transforming the laser light into either an illumination beam for imaging a portion of the IC 210, or a laser beam for heating a smaller portion of the IC 210 to form silicide. To produce an illumination beam, a condenser lens 264 and a field lens 266, similar to those employed in the embodiment of the FIG. 11, are pivoted or placed into the path of the laser light from the second end of the optical fiber 244. As described above, the condenser lens 264 converges the laser light to form an image at an aperture stop 268, which may provide an adjustable iris to control the brightness of the resulting illumination beam. The imaging area provided by the laser light is then controlled by a field stop 270, as described in relation to the optical coupling apparatus 220 of FIG. 11. The laser light then encounters the field lens 266, which produces an illumination beam, as discussed above.

To produce a laser heating beam, the condenser lens 264 and the fields lens 266 are pivoted or translated away from the laser light directed through the configurable laser light converter 262. Instead, a collimating lens 272 is placed or pivoted into the path of the laser light emitted from the second end of the optical fiber 244 to produce a heating beam. In one embodiment, the openings of both the aperture stop 268 and the field stop 270 are sufficiently large that the collimated heating beam is not impeded by either stop. When illumination is required, the collimating lens 272 is removed from the path of the laser light, while the condenser lens 264 and the field lens 266 are placed into the path of the light.

The movement of the field lens 264, condenser lens 266 and collimating lens 272 may be accomplished by a number of mechanisms known in the art. In addition, the mechanism may be motor driven and/or computer controlled to alter the configuration of the configurable laser light converter 262 from an imaging mode to a heating mode, and vice-versa.

Once the laser heating beam or the laser illuminating beam exits the configurable laser light converter 262, the beam encounters a beam splitter 272, which directs a substantial amount of the beam (for example, 95%) the port 209 of the dual column tool 200. As in the embodiment of FIG. 11, any portion of the beam that is not directed to the port 209 proceeds to a beam trap 274, which eliminates substantially all reflections from the trap 274 that may interfere with the directed portion of the beam.

As before, once the beam enters the port 209, one or more lenses 202 typically direct the laser beam toward an objective lens 203, which focuses, or at least converges or collimates, the beam onto the IC 210.

In imaging mode, the laser light reflected from the IC 210 constitutes an imaging beam, which is directed back to the port 209 of the dual column tool 200 via the objective lens 203 and the one or more mirrors 202. Once the imaging beam exits the port 209, it encounters the beam splitter 272, which is configured to allow the imaging beam to pass therethrough to an image sensor 242, such as a CCD camera.

One advantage of the particular embodiment of FIG. 12 is that a simpler optical configuration to that employed in the embodiment of FIG. 11 is utilized, primarily due to the use of a single beam splitter, resulting in approximately twice the amount of light power delivered to the IC 210. Also, since a laser source, which generates substantially monochromatic light, is employed as the illumination source, an optical bandpass filter is not required. On the other hand, the use of monochromatic light reduces the ability to produce more than a single wavelength or band of light to provide high-contrast images for various IC surfaces. Also, unlike the embodiment of the FIG. 11, the optical coupling apparatus 260 of FIG. 12 does not allow simultaneous imaging and heating of the IC 210. Instead, the image mode is used to center the IC location to be heated, and then the heating mode is employed to perform silicidation. During the heating process, the image sensor 242 may detect a light spot in the center of the field of view due to reflection of the laser heating beam back through the beam splitter 272, mirrors 202 and objective lens 203, but the remainder of the field of view likely will not provide an image of the IC.

FIG. 13 illustrates a third embodiment of a focused ion beam tool employing a laser assembly for silicide formation at a target IC. The FIB tool includes an optical coupling apparatus with an illumination/heating optical arrangement yielding a localized heating mechanism in conjunction with a confocal scanning microscope configuration. In other words, the optical image is not produced in its entirety instantaneously, as is normally provided by standard microscopy techniques, but is formed pixel by pixel via multiple scan lines, in a fashion similar to a television or a focused ion beam image.

As discussed in relation to the embodiments of FIGS. 11 and 12, a laser source 208 is coupled to an optical fiber 244 for transmission of laser light to a collimating lens 282 to produce a collimated laser beam. Typically, a fiber coupling lens 246 is also employed to converge the rays of the laser light from the laser source 208 into a first end of the optical fiber 244. As before, the laser source 208 is employed to form localized silicide by way of heating the IC 210 at the area of interest. In addition, the collimated laser beam also serves as the illumination source for imaging an area of the IC 210.

The collimated laser beam passes through a polarizing beam splitter 294 adapted to allow a majority of the linearly polarized laser beam (for example, 95%) to pass therethrough and deflect beam of polarization state perpendicular to incoming beam. The beam splitter 294 is discussed further below.

To provide a pixel-by-pixel scanned image, the collimated laser beam is moved about an area of the IC 210 in both horizontal and vertical directions by way of two beam scanners 284, which may be oscillatory scanners (such as galvanometric scanners), acousto-optic scanners, rotating polygons, or the like. As illustrated in FIG. 13, a horizontal scan mirror 286 and a vertical scan mirror 288 are each manipulated or rotated by any of the aforementioned mechanisms to cause the collimated laser beam to cover an imaging area of the IC 210. In an alternative embodiment, a single scan mirror may be utilized to move the collimated laser beam in both horizontal and vertical directions to cover the imaging area. Also, while the horizontal scan mirror 286 is shown in FIG. 13 preceding the vertical scan mirror 288 along the optical path of the collimated laser beam, the opposite ordering may be employed in the alternative.

As the collimated laser beam leaves the second of the two scan mirrors 286, 288, a pair of scanning lenses 290 are located in the optical path after the second scan mirror 288. The scan lenses propagate the image from the scan mirrors onto an exit pupil of the objective lens. If the objective lens is not infinite corrected, a single scan lens is sufficient to propagate the image from the scan mirror onto the exit pupil of the objective lens.

After exiting the scanning lens 290, the scanned laser beam is directed to the port 209 of the dual column tool 200 by way of an alignment mirror 292. In an alternative embodiment, the optical coupling apparatus 280 may be rotated 90 degrees so that the scanned laser beam exits the scanning lenses 290 and enters the port 209 directly without the aid of an intervening mirror. From there, the optical path within the dual column tool 200 is the same as described with respect to FIGS. 11 and 12 (i.e., by way of one or more mirrors 202 and an objective lens 203). A quarter-waveplate 295 converts linearly polarized light to circularly polarized light.

After encountering the IC 210, at least a portion of the collimated laser beam is reflected back through the objective lens 203 and onto the at least one mirror 202 of the dual column tool 200, whereby it exits the dual column tool 200 at the port 209. The circularly polarized light of returned beam has opposite orientation of circular polarization of the incoming beam. When the returned beam passes through quarter-waveplate 295, the beam becomes linearly polarized again, but with orientation perpendicular to the incoming beam. Once the reflected beam is directed by the alignment mirror 292, the scanning lenses 290, and the scan mirrors 286, 288, the reflected beam encounters the polarizing beam splitter 294, which directs a significant portion of the beam toward a spatial filter 300. The spatial filter includes a focusing lens 296 and a pinhole structure 298, or other structure defining an aperture. Generally, the spatial filter 300 removes out-of-focus light reflected from the IC 210, thereby enhancing the returned image contrast.

Figure 14:
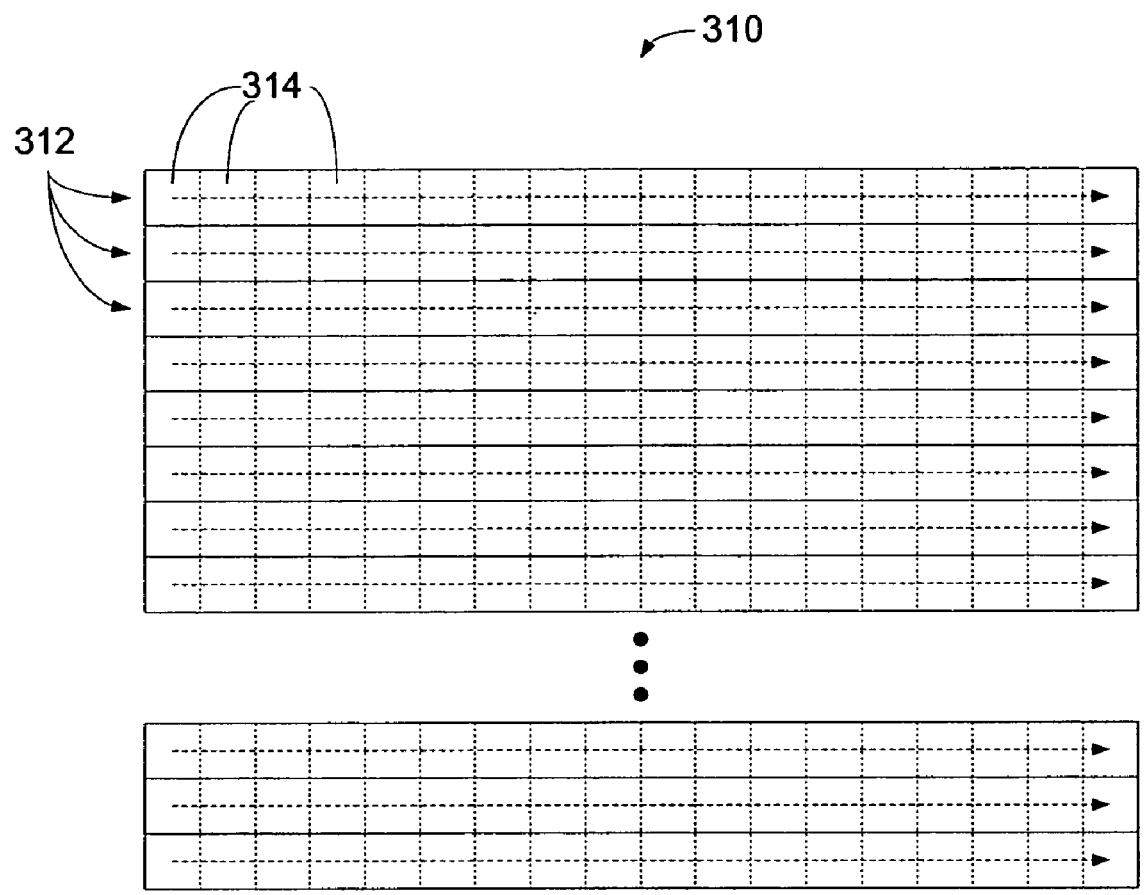
FIG. 14 is a diagram of an imaging area described by the laser coupling apparatus of FIG. 13.

The reflected laser beam, as filtered by the spatial filter 300, encounters a single-element photo-detector 302, such as a photodiode or a photomultiplier, to detect the amount of light returning from the IC 210. The photo-detector 302 then indicates the amount of light detected by way of voltage, current, or the like to a frame grabber 304, which stores the intensity indication for that pixel internally. When imaging an area of the IC 210, the frame grabber 304 collects the intensity indication for each pixel scanned by the collimated laser beam, ultimately presenting that data to a display device (not shown) frame by frame Controlling the operation of the one or more beam scanners 284 is a scanning controller 306 or similar device, which produces the signals that cause the beam scanners 284 to move the scan mirrors 286, 288 in order to control the location of the collimated laser beam over an imaging area of the IC 210. As shown in FIG. 14, an imaging area 310 of the IC is typically rectangular, and is composed of multiple horizontal scan lines 312, with each scan line containing multiple pixels 314. A focused light spot formed on the IC 210 by the collimated laser beam is moved about the IC by the horizontal and vertical scan mirrors 286, 288 along the horizontal scan lines 312 so that the each pixel 314 of the imaging area is individually illuminated. Typically, the beam follows each scan line in the same direction (left to right, in the example of FIG. 14). The collimated beam may be moved in a continuous fashion along each of the horizontal scan lines 312, or the beam may be temporarily located on each pixel 314 of the imaged area while the photo-detector 302 detects the intensity of light reflected from the IC 210.

In one embodiment, the scanning controller 306 may also control the location and size of the imaging area of the IC 210 by way of the location, length, and number of horizontal scan lines 312.

In addition to the indication of light intensity from the photo-detector 302, the frame grabber 304 also accepts the position of the collimated laser beam on the IC 210 within the imaging area, typically by way of horizontal and vertical coordinates. The coordinates are received from the scanning controller 306 as depicted in FIG. 13.

In heating mode, the collimated laser beam is not scanned across an imaging area, but is instead held statically over a particular location of the IC 210 to effect silicide formation of a localized area. Accordingly, the scan mirrors 286, 288 are held in a constant position to hold the beam at the point of interest. As a result, one possible advantage of the embodiment of FIG. 14 is that any location within a potential imaging area of the IC 210 may be heated by locating the beam appropriately by way of the scan mirrors 286, 288. In other words, the IC location to be heated need not reside at the center of the imaging area.

Use of the optical coupling apparatus 280 of FIG. 13 often results in enhanced image quality, a trait shared by most confocal scanning microscopy devices. Further, laser transmission is enhanced due to the utilization of a single beam splitter and a reduced number of lenses in the optical coupling apparatus 280.

Multiple lasers or LED sources could be coupled into a single fiber by way of an optical switch 245 as described in FIG. 12. Although various representative embodiments of this invention have been described above with a certain degree of particularity, those skilled in the art could make numerous alterations to the disclosed embodiments without departing from the spirit or scope of the inventive subject matter set forth in the specification and claims. All directional references (e.g., upper, lower, upward, downward, left, right, leftward, rightward, top, bottom, above, below, vertical, horizontal, clockwise, and counterclockwise) are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. In methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

The invention claimed is:

1. A charged particle beam apparatus having dual optical illumination for operating on an integrated circuit (IC), comprising:
   a particle beam column having a particle beam path and an optical path;
   a laser source producing a laser beam;
   a light source producing a light beam;
   an optical coupling assembly coupling the laser beam and the light beam into the column to thereby follow the optical path;
   an image sensor receiving reflections from the IC via the optical path.

2. The apparatus of claim 1, wherein the light source comprises a whitelight source.

3. The apparatus of claim 2, further comprising optical elements to direct the light beam to generate flood illumination.

4. The apparatus of claim 2, further comprising a filter positioned in a path of the light beam.

5. The apparatus of claim 1, wherein the particle beam column comprises a single optical port and wherein the optical coupling assembly couples the laser beam and the light beam through the single optical port to thereby have the laser beam and light beam to follow substantially the same path within the column.

6. The apparatus of claim 1, wherein the optical path is configured to direct the laser beam onto the IC so as to apply heat to a localized area of the IC.

7. The apparatus of claim 1, further comprising a collimation lens provided in a path of the laser beam so as to control laser spot size.

8. The apparatus of claim 1, wherein the laser source comprises a pulsed laser source.

9. The apparatus of claim 1, wherein the light source comprises a second laser source.

10. The apparatus of claim 9, further comprising a configurable laser light converter configured for transforming laser illumination into either an illumination beam or a heating beam.

11. The apparatus of claim 10, wherein the configurable laser light converter comprises a condenser lens, a field lens and a collimating lens.

12. The apparatus of claim 11, wherein the collimating lens is translatable in and out of an optical path defined within the configurable laser light converter.

13. The apparatus of claim 12, wherein the condenser lens and the field lens are translatable in and out of the optical path defined within the configurable laser light converter.

14. The apparatus of claim 10, further comprising an optical switch for selectively coupling light from the laser source and the second laser source onto the configurable laser light converter.

15. The apparatus of claim 11, further comprising an objective lens and wherein the image sensor is coupled to the optical coupling assembly.

16. The apparatus of claim 10, the configurable laser light converter is structured to assume a first configuration wherein entering laser light is converted to a first light beam comprising a first width, and a second configuration wherein entering laser light is converted to a second light beam comprising a second width narrower than the first width.

17. The apparatus of claim 12, the first configuration of configurable laser light converter comprising: a condenser lens optically coupled with the laser source; an aperture stop optically coupled with the condenser lens; a field stop optically coupled with the aperture stop; and a field lens optically coupled with the field stop.

18. A charged particle beam apparatus having dual optical illumination for operating on an integrated circuit (IC), comprising:
- a particle beam column having a particle beam path and an optical path;
- a laser source producing a laser beam;
- first optics conditioning the laser beam so as to apply heat to a localized area of the IC;
- a whitelight source producing a light beam;
- second optics conditioning the light beam to illuminate an area of the IC;
- an optical coupling assembly coupling the laser beam and the light beam into the column to thereby follow the optical path;
- an image sensor receiving reflections of the light beam from the IC via the optical path.

19. The apparatus of claim 18, further comprising a selectable bandpass filter positioned in a path of the light beam.

20. The apparatus of claim 19, further comprising a fiber optics coupled to the whitelight source, an aperture stop at the image plane of the fiber optics, an a field stop positioned at the conjugate of the IC's image plane.

* * * * *